US012236857B2

(12) United States Patent
Zen et al.

(10) Patent No.: US 12,236,857 B2
(45) Date of Patent: *Feb. 25, 2025

(54) SIGNAL PROCESSING APPARATUS, SIGNAL PROCESSING METHOD, AND DISPLAY APPARATUS

(71) Applicant: SATURN LICENSING LLC, New York, NY (US)

(72) Inventors: Masao Zen, Chiba (JP); Tetsuo Ikeyama, Kanagawa (JP); Daisuke Miki, Tokyo (JP); Syunsuke Kikuchi, Aichi (JP); Kazuhiro Nukiyama, Kanagawa (JP); Kazutaka Kobayashi, Kanagawa (JP); Yasushi Konuma, Kanagawa (JP); Kazuki Uchida, Kanagawa (JP); Masayoshi Sasaki, Tokyo (JP); Masayuki Okochi, Tokyo (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/240,600

(22) Filed: Aug. 31, 2023

(65) Prior Publication Data
US 2023/0410733 A1 Dec. 21, 2023

Related U.S. Application Data

(63) Continuation of application No. 17/918,182, filed as application No. PCT/JP2021/015794 on Apr. 19, 2021, now Pat. No. 11,817,048.

(30) Foreign Application Priority Data

May 1, 2020 (JP) .................................. 2020-081149

(51) Int. Cl.
*G09G 3/3208* (2016.01)
(52) U.S. Cl.
CPC ..... *G09G 3/3208* (2013.01); *G09G 2320/041* (2013.01); *G09G 2320/0626* (2013.01); *G09G 2330/023* (2013.01); *G09G 2360/145* (2013.01)

(58) Field of Classification Search
CPC .......... G09G 3/3208; G09G 2320/041; G09G 2320/0626; G09G 2330/023;
(Continued)

(56) References Cited

U.S. PATENT DOCUMENTS

| 10,325,552 | B2 | 6/2019 | Jeong et al. |
| 11,158,678 | B2 | 10/2021 | Inoue |
| 2005/0068270 | A1 | 3/2005 | Awakura et al. |
| 2007/0201056 | A1* | 8/2007 | Cok ........................ B82Y 30/00 358/1.9 |
| 2010/0149167 | A1* | 6/2010 | Hasegawa ............ G09G 3/3225 345/213 |

(Continued)

FOREIGN PATENT DOCUMENTS

| CN | 1620679 | 5/2005 |
| CN | 109891486 | 6/2019 |

(Continued)

OTHER PUBLICATIONS

International Search Report for Application No. PCT/JP2021/015794 mailed Jul. 6, 2021, pp. 1-3.

*Primary Examiner* — Amare Mengistu
*Assistant Examiner* — Gloryvid Figueroa-Gibson
(74) *Attorney, Agent, or Firm* — Richard LaPeruta

(57) ABSTRACT

The present technology relates to a signal processing apparatus, a signal processing method, and a display apparatus that are able to provide suitable functionality according to applications. The signal processing apparatus provided by (Continued)

the present technology includes a signal processing section that acquires at least one of first information regarding a color of a video to be displayed on a panel section, second information regarding brightness of a screen of the panel section, and third information measured as a physical quantity related to the panel section, and that performs, on the basis of the acquired information, adaptive control of a voltage according to a load on and an application of the panel section. The voltage is used for driving the panel section. The present technology is applicable, for example, to a self-luminous display apparatus.

20 Claims, 18 Drawing Sheets

(58) Field of Classification Search
CPC ....... G09G 2360/145; G09G 2320/029; G09G 2330/021; G09G 2330/028; G09G 2360/16; G09G 5/02; G09G 5/10; H04N 5/57; H04N 5/66

USPC ........................................................ 345/207
See application file for complete search history.

(56) References Cited

U.S. PATENT DOCUMENTS

| | | | |
|---|---|---|---|
| 2015/0228090 A1* | 8/2015 | Okawa | H04N 1/60 345/604 |
| 2016/0140894 A1* | 5/2016 | Eun | H04N 13/356 345/212 |
| 2016/0155382 A1 | 6/2016 | Cheon et al. | |
| 2018/0005586 A1* | 1/2018 | Park | G09G 3/3233 |

FOREIGN PATENT DOCUMENTS

| | | |
|---|---|---|
| EP | 2357632 | 8/2011 |
| EP | 2357632 A1 | 8/2011 |
| EP | 3264404 | 1/2018 |
| EP | 3264404 A1 | 1/2018 |
| JP | 2005208228 A | 8/2005 |
| JP | 2010145664 A | 7/2010 |
| KR | 20040069562 | 8/2004 |

\* cited by examiner

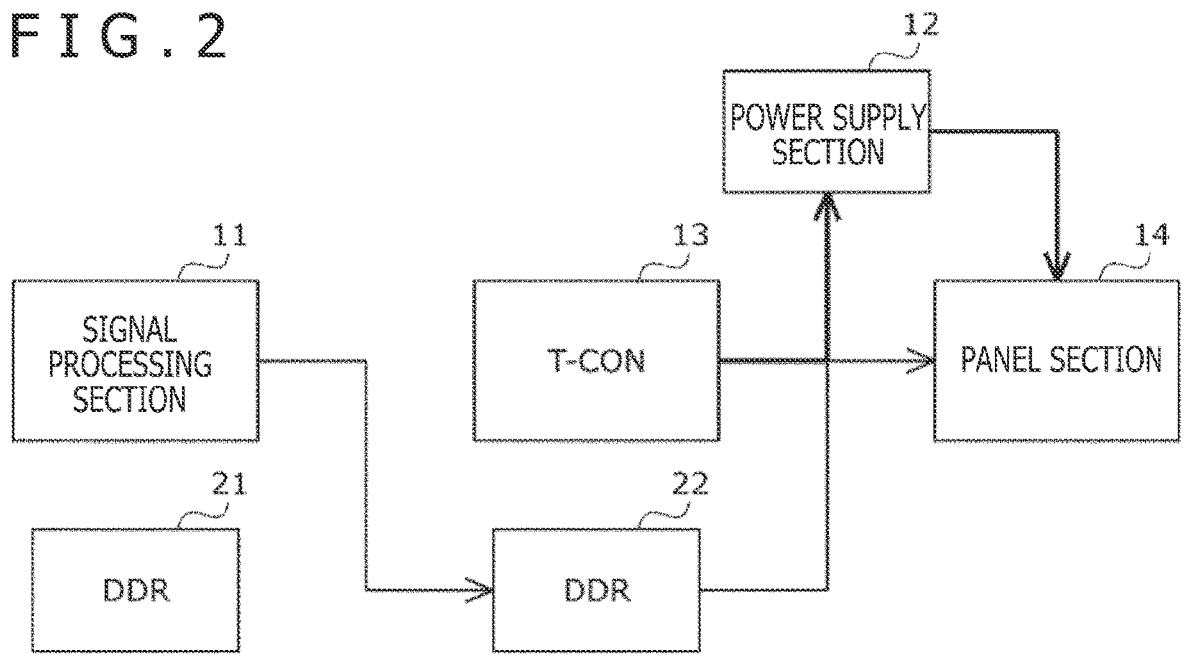
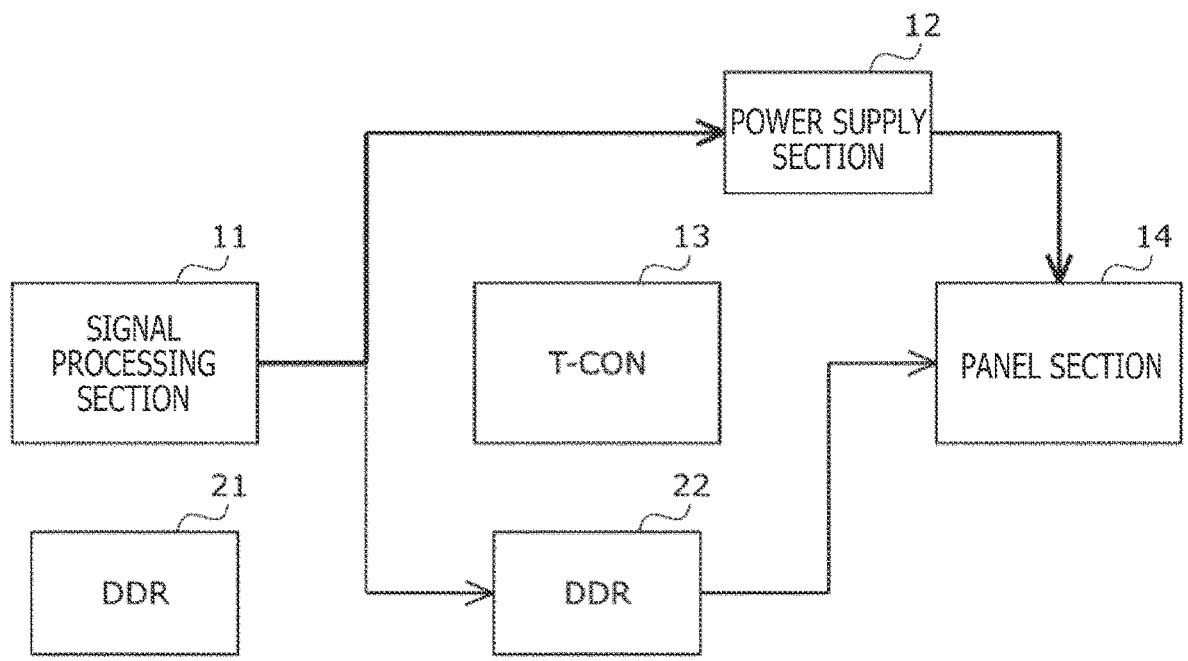

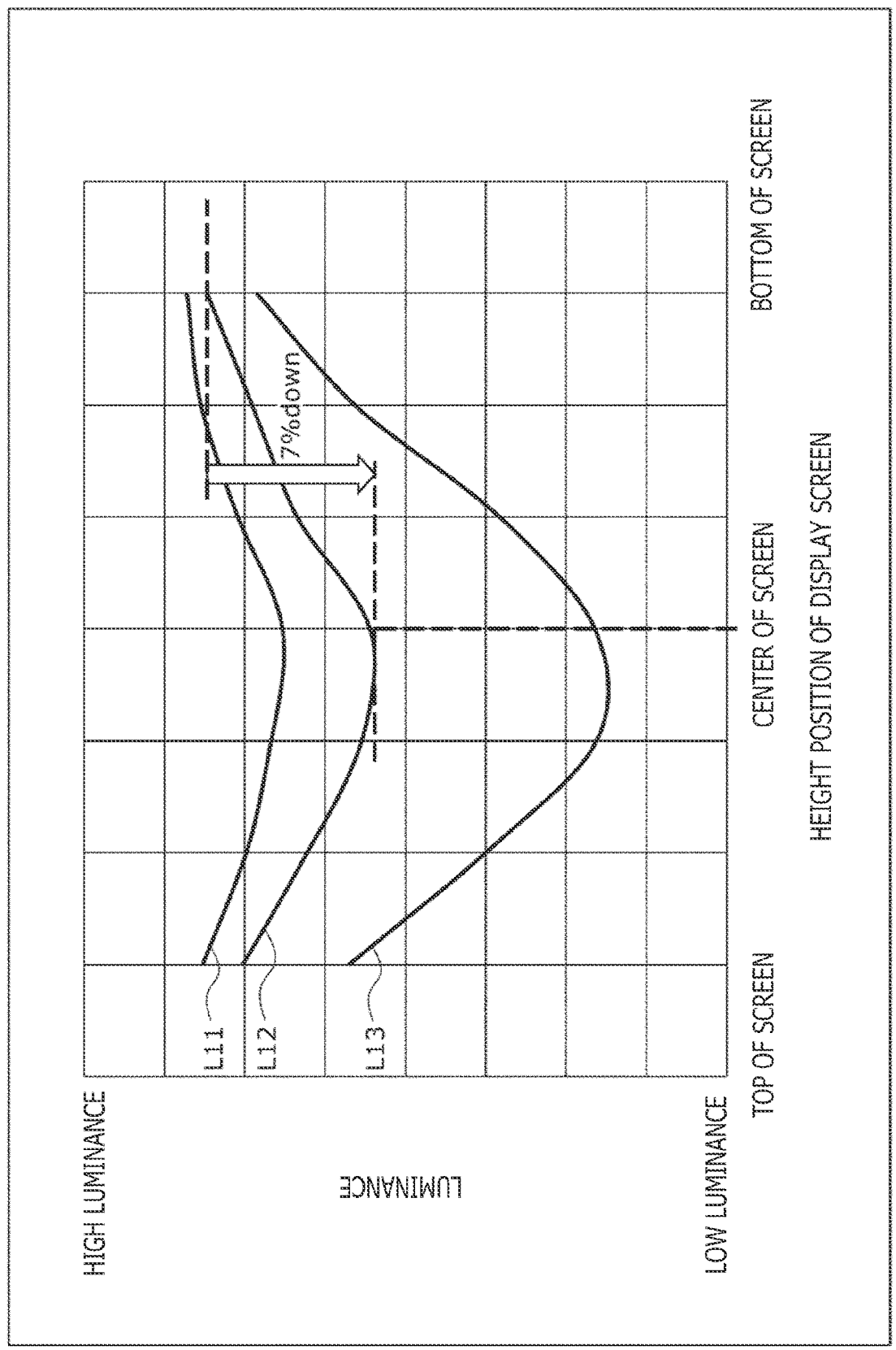

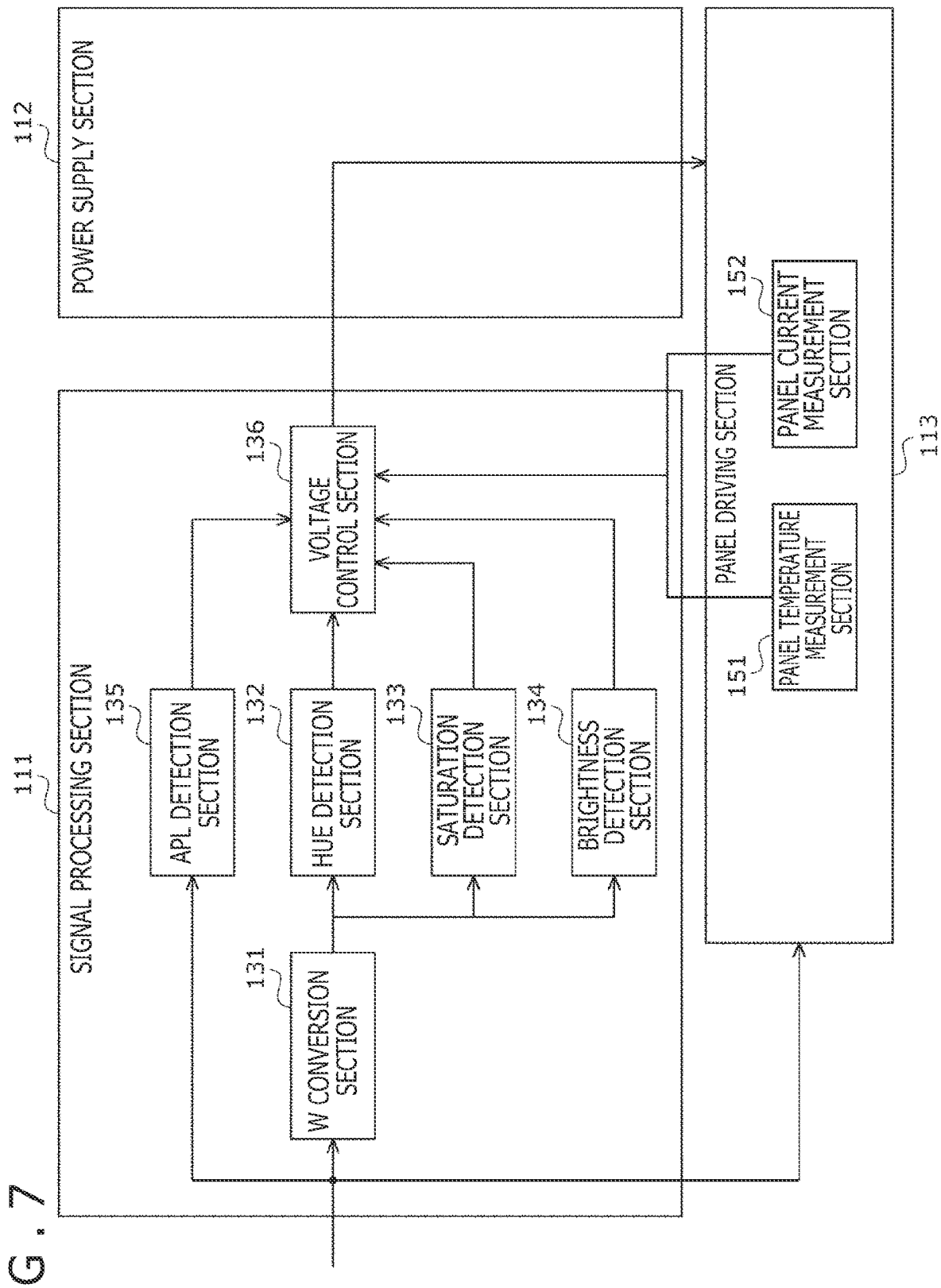
F I G. 7

SIGNAL PROCESSING APPARATUS, SIGNAL PROCESSING METHOD, AND DISPLAY APPARATUS

CROSS REFERENCE TO RELATED APPLICATIONS

The present application is a continuation of U.S. patent application Ser. No. 17/918,182 filed on Oct. 11, 2022, which is a national phase entry under U.S.C. § 371 of International Application No. PCT/JP2021/015794 filed on Apr. 19, 2021, published as WO 2021/1220852, which claims priority from Japanese Patent Application No. 2020-081149 filed on May 1, 2020, all of which are hereby incorporated herein by reference in their entireties.

TECHNICAL FIELD

The present technology relates to a signal processing apparatus, a signal processing method, and a display apparatus, and more particularly relates to a signal processing apparatus, a signal processing method, and a display apparatus that are able to perform suitable control according to applications.

BACKGROUND

In recent years, OLED display apparatuses and other self-luminous display apparatuses are becoming mainstream video display devices. For example, in U.S. Pat. No. 10,325,552, a low power consumption technology is disclosed as a technology for the OLED display apparatuses.

SUMMARY

Incidentally, it is demanded that display apparatuses such as self-luminous display apparatuses perform suitable control according to applications where, for example, low power consumption is to be achieved.

In view of the above circumstances, the present technology has been made to perform suitable control according to applications.

A signal processing apparatus according to an aspect of the present technology includes a signal processing section that acquires at least one of first information regarding a color of a video to be displayed on a panel section, second information regarding brightness of a screen of the panel section, and third information measured as a physical quantity related to the panel section, and that performs, on the basis of the acquired information, adaptive control of a voltage according to a load on and an application of the panel section. The voltage is used for driving the panel section.

A signal processing method according to an aspect of the present technology includes, by a signal processing apparatus, acquiring at least one of first information regarding a color of a video to be displayed on a panel section, second information regarding brightness of a screen of the panel section, and third information measured as a physical quantity related to the panel section, and performing, on the basis of the acquired information, adaptive control of a voltage according to a load on and an application of the panel section. The voltage is used for driving the panel section.

In the signal processing apparatus and the signal processing method according to the aspect of the present technology, at least one of the first information regarding the color of the video to be displayed on the panel section, the second information regarding the brightness of the screen of the panel section, and the third information measured as the physical quantity related to the panel section is acquired. Further, on the basis of the acquired information, adaptive control of the voltage, which is used for driving the panel section, is performed according to the load on and the application of the panel section.

A display apparatus according to an aspect of the present technology includes a panel section and a signal processing section. The signal processing section acquires at least one of first information regarding a color of a video to be displayed on a panel section, second information regarding brightness of a screen of the panel section, and third information measured as a physical quantity related to the panel section, and performs, on the basis of the acquired information, adaptive control of a voltage according to a load on and an application of the panel section. The voltage is used for driving the panel section.

In the display apparatus according to the aspect of the present technology, at least one of the first information regarding the color of the video to be displayed on the panel section, the second information regarding the brightness of the screen of the panel section, and the third information measured as the physical quantity related to the panel section is acquired. Further, on the basis of the acquired information, adaptive control of the voltage, which is used for driving the panel section, is performed according to the load on and the application of the panel section.

The signal processing apparatus and the display apparatus according to an aspect of the present technology may be independent apparatuses or may be internal blocks included in an apparatus.

BRIEF DESCRIPTION OF THE DRAWINGS

FIG. 2 is a diagram illustrating an example where functionality is implemented by a timing controller.

FIG. 3 is a diagram illustrating an example where the functionality is implemented by a set substrate.

FIG. 4 is a diagram illustrating an example of the screen luminance of a panel section driven by a panel driving voltage.

FIG. 7 is a block diagram illustrating an example of a detailed configuration of a signal processing section.

DETAILED DESCRIPTION

1. Embodiment of Present Technology
(Low Power Consumption)

A technology for adjusting a reference gamma voltage and a driving voltage by measuring an APL (Average Picture Level) and a maximum grayscale value of an image is known as a low power consumption technology for OLED display apparatuses. In a case where this type of technology is used, a determination process is performed by using only the measured APL and maximum grayscale value. Therefore, the difference in amperage with respect to light emission of each pixel disposed on a display panel cannot be taken into consideration. This makes it impossible to grasp the load on the entire screen of the display panel.

Pixels disposed two-dimensionally on the display panel can each include four sub-pixels of white (W), red (R), green (G), and blue (B), or three sub-pixels of red (R), green (G), and blue (B). A system based on a WRGB pixel is hereinafter referred to as the WRGB system, and a system based on an RGB pixel is hereinafter referred to as the RGB system.

As regards each pixel on a display panel based on the WRGB system, a current applied thereto varies according to the light emission levels of white (W), red (R), green (G), and blue (B). As regards each pixel on a display panel based on the RGB system, a current applied thereto varies according to the light emission levels of red (R), green (G), and blue (B). Therefore, if information regarding colors is not taken into account, it is difficult to accurately grasp (predict) the load on the entire screen of the display panel.

Figure 1:
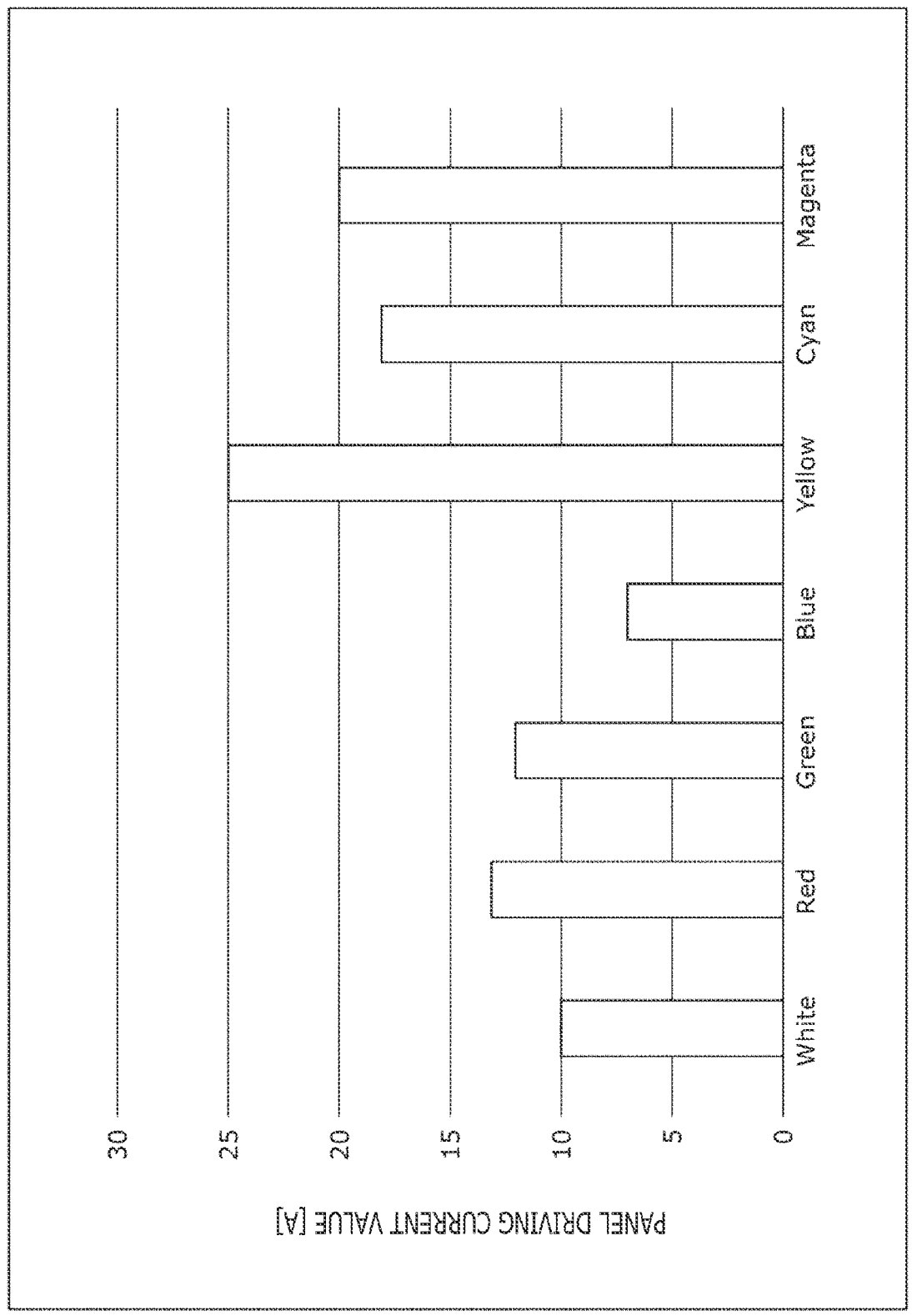
FIG. 1 is a diagram illustrating the relation between color components of each pixel and current values.

FIG. 1 illustrates the relation between color components of each pixel and current values. In FIG. 1, the horizontal axis indicates colors (White, Red, Green, and Blue) of the sub-pixels and colors (Yellow, Cyan, Magenta) produced when two sub-pixels of different colors emit light, whereas the vertical axis indicates panel driving current values. In each pixel, yellow (Y) is produced when the sub-pixels of R and G emit light, magenta (M) is produced when the sub-pixels of R and B emit light, and cyan (C) is produced when the sub-pixels of G and B emit light.

In FIG. 1, the current value of each color component is indicated by a vertically extended bar of each color component. As can be seen from this bar graph in FIG. 1, the current value varies from one color component to another. Particularly, in the case of yellow (Y), magenta (M), and cyan (C), the current value is remarkably increased because two sub-pixels of different colors are made to emit light.

Further, a timing controller (T-CON) is provided in the display panel of the OLED display apparatus. In a case where the timing controller is used for function implementation, there is no differential delay between the voltage drive and a video signal because a frame memory is provided. Thus, a delay corresponding to a transient response of a power supply is always caused. This leaves a problem that real-time based processing cannot be performed.

More specifically, FIG. 2 illustrates a configuration in a case where functionality is implemented by a timing controller 13 provided in a panel section 14. In the configuration depicted in FIG. 2, the timing controller 13 controls a panel driving voltage through a power supply section 12. However, a video signal processed by a signal processing section 11 is retained in a frame memory 22. Therefore, it is difficult to simultaneously control the voltage drive and the video signal.

FIG. 3 illustrates a configuration in a case where the functionality is implemented by the signal processing section 11 which is configured, for example, as a video SoC on a set substrate. In the configuration depicted in FIG. 3, the signal processing section 11 controls the panel driving voltage through the power supply section 12. Therefore, the timing controller 13 has an additional capacity equivalent to a frame buffer provided by the frame memory 22.

(Luminance Increase)

To provide increased luminance in a stable manner, the OLED display apparatuses need to increase the panel driving voltage. For example, if the voltage value is low in a case where an attempt is made to increase the luminance of a video such as a window pattern, the luminance of a screen center of the display panel does not increase. This causes a problem where the luminance varies from one on-screen location to another.

FIG. 4 illustrates an example of the screen luminance of the panel section 14 driven by the panel driving voltage. In FIG. 4, the horizontal axis corresponds to the height position of the screen of the panel section 14, and a substantially central portion of the horizontal axis corresponds to the center of the screen in the height direction. Further, the horizontal axis indicates that the distance from the top of the screen decreases with a decrease in the distance from the leftmost end of the horizontal axis, and that the distance from the bottom of the screen decreases with a decrease in the distance from the rightmost end of the horizontal axis. The vertical axis represents luminance, and indicates that the luminance increases with a decrease in the distance from the uppermost end of the vertical axis and decreases with a decrease in the distance from the lowermost end of the vertical axis.

In FIG. 4, thick lines L11 to L13 indicate the screen luminance dependent on the panel driving voltage. The thick line L11 indicates a case where the panel driving voltage is V11, the thick line L12 indicates a case where the panel driving voltage is V12, and the thick line L13 indicates a case where the panel driving voltage is V13. However, these panel driving voltages are in the relation indicated by the relational expression V11>V12>V13.

Incidentally, if the voltage value of the panel driving voltage is low (the voltage values of V12 and V13 are lower than the voltage value of V11) as indicated, for example, by the thick line L12 or the thick line L13 when an attempt is made to increase the luminance of a video such as a window pattern, the luminance of the screen center of the panel section 14 does not increase. As a result, the luminance varies from one on-screen location to another. For example, in a case where the panel driving voltage indicated by the thick line L12 is V12, the center of the screen is predetermined several percent lower (e.g., approximately seven percent lower in the case of FIG. 4) in luminance than an on-screen location near the top or bottom of the screen.

Although depending on the power wiring in the panel section 14, the above-described luminance variation is caused by the difference in current supply between an illuminated portion and a non-illuminated portion of the screen of the panel section 14. In order to increase the luminance, it is necessary to increase the panel driving voltage (e.g., increase the panel driving voltage to V11 as indicated by the thick line L11 in FIG. 4).

Figure 5:
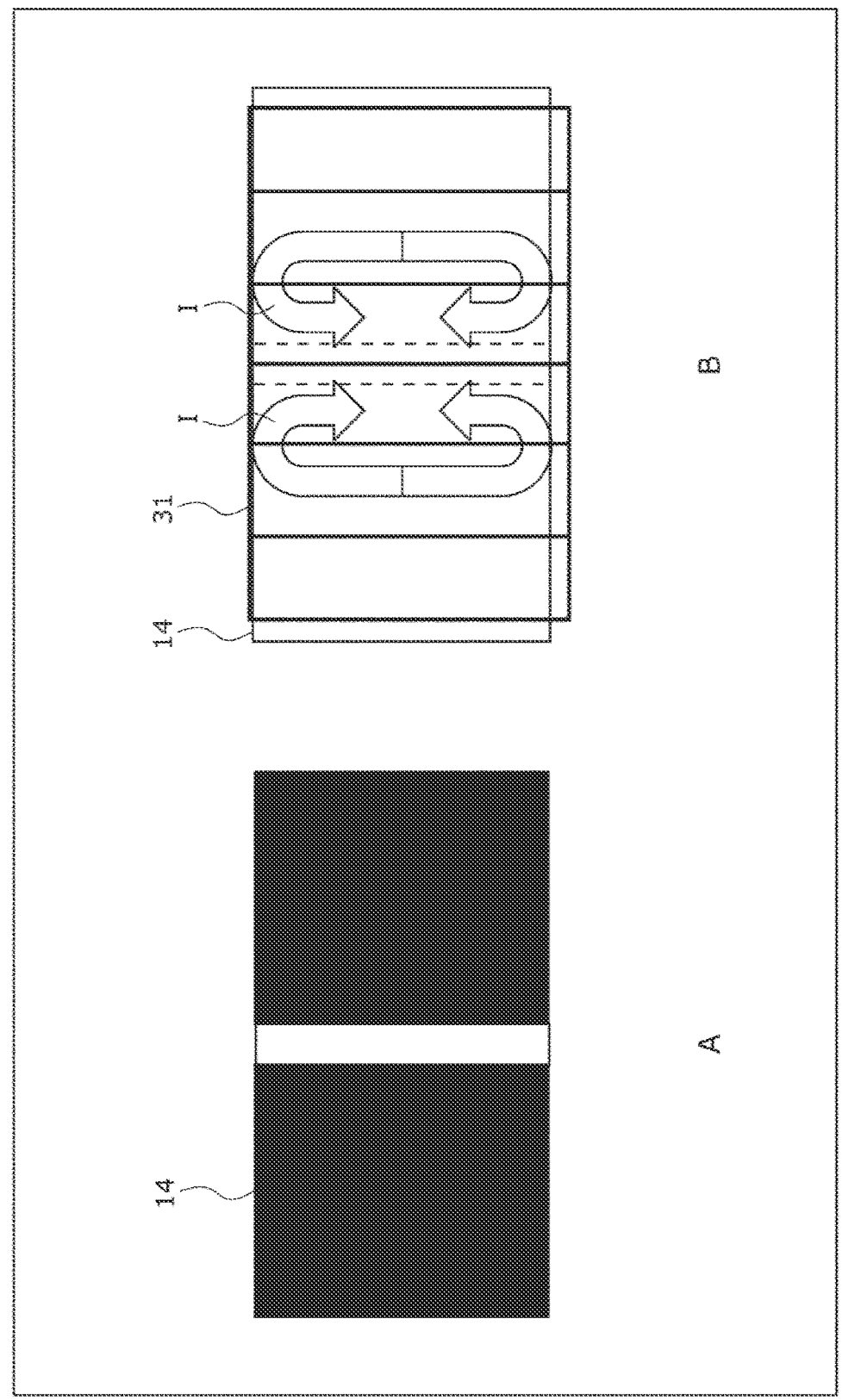
FIG. 5 illustrates schematic diagrams illustrating the relation between power wiring and current supply in the panel section.

FIG. 5 schematically illustrates the relation between power wiring and current supply in the panel section 14. In a case where the video of a window pattern (a white area) as depicted in A of FIG. 5 is displayed on the panel section 14, the relation between power wiring and current supply in the panel section 14 is as depicted in B of FIG. 5. It should be noted that a rectangle indicated by broken lines in B of FIG. 5 corresponds to the window pattern depicted in A of FIG. 5.

More specifically, the flow of a current I supplied through power wiring 31 in the panel section 14 is indicated by U-turn arrows in B of FIG. 5. Since the current is supplied from an area outside the window pattern, a voltage drop at the top and bottom of the screen is smaller than that at the center of the screen. However, the current does not flow well at the center of the screen. This prevents the luminance from increasing. Consequently, the panel driving voltage needs to be increased in order to increase the luminance.

(Temperature Rise Suppression)

Further, in the OLED display apparatuses, power consumption inadvertently increases when the panel driving voltage is simply increased in order to increase the luminance. Therefore, when the panel driving voltage is constantly increased, the temperature of the display panel rises, so that a high load state persists. This causes, for example, a reliability problem such as screen burn-in.

The present technology proposes a method of addressing the above-described problem. An embodiment of the present technology will now be described with reference to the accompanying drawings.

(Apparatus Configuration)

Figure 6:
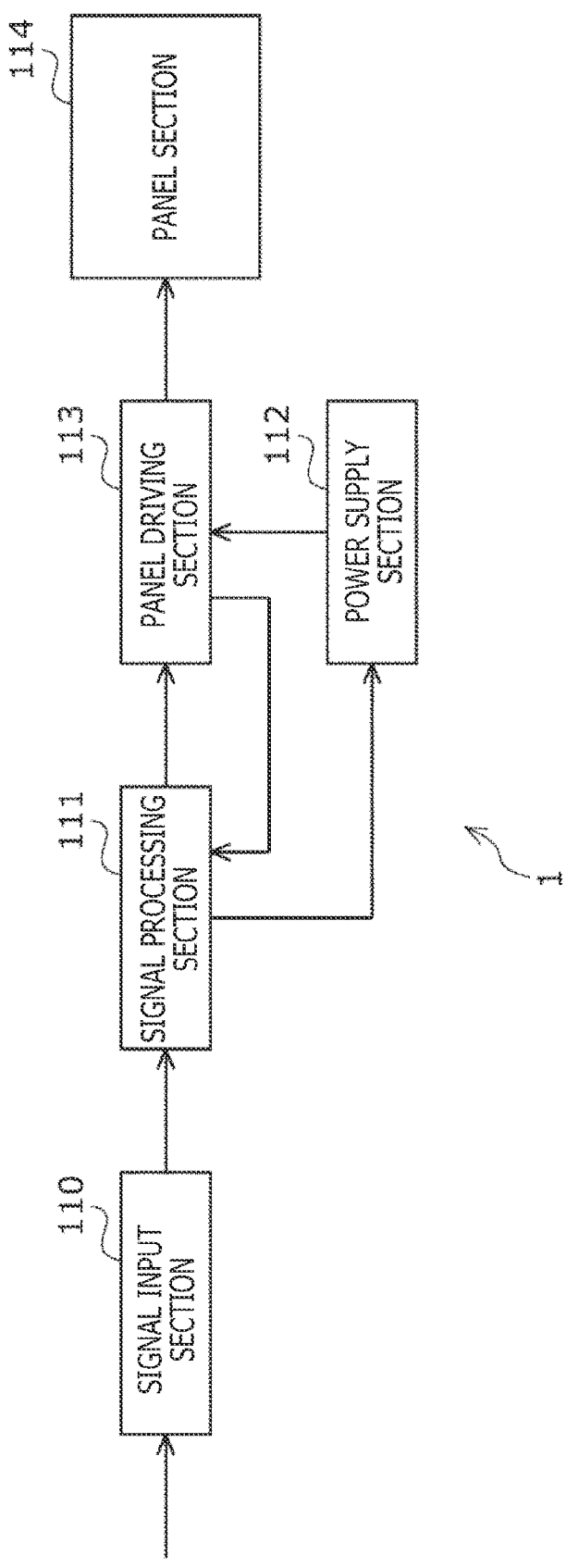
FIG. 6 is a block diagram illustrating a configuration example of an embodiment of a display apparatus to which the present technology is applied.

FIG. 6 illustrates a configuration example of an embodiment of a display apparatus to which the present technology is applied.

A display apparatus 1 is a self-luminous display apparatus such as an OLED display apparatus having an OLED panel. The display apparatus 1 is configured, for example, as a television receiver.

Referring to FIG. 6, the display apparatus 1 includes a signal input section 110, a signal processing section 111, a power supply section 112, a panel driving section 113, and a panel section 114.

The signal input section 110 includes, for example, a tuner connected to an antenna, a communication module connectable to the Internet or other communication network, or an input interface compliant with a predetermined standard.

The signal input section 110 supplies a video signal of various types of content to the signal processing section 111. The various types of content include broadcast content transmitted, for example, by terrestrial broadcasting or satellite broadcasting, communication content streamed through the Internet or other communication network, and recorded content recorded in a recording medium such as an optical disk or a semiconductor memory or recorded in a recorder.

The signal processing section 111 performs a video signal process on the video signal of content supplied from the signal input section 110, and supplies the resulting processed video signal to the panel driving section 113. Further, through the power supply section 112, the signal processing section 111 controls a panel driving voltage for causing the panel driving section 113 to drive the panel section 114.

On the basis of the video signal supplied from the signal processing section 111 and the panel driving voltage controlled by the signal processing section 111, the panel driving section 113 drives the panel section 114. Further, the panel driving section 113 measures the surface temperature and amperage of the panel section 114, and supplies the measured result to the signal processing section 111.

The panel section 114 includes a display panel such as an OLED panel. On the basis of the driving from the panel driving section 113, the panel section 114 displays a video according to the video signal of various types of content.

The OLED panel is a display panel in which pixels having OLED elements as self-luminous elements are disposed two-dimensionally. An OLED (Organic Light Emitting Diode) is a light-emitting element having a structure where an organic luminescent material is sandwiched between a cathode and an anode, and is included in the pixels (display pixels) that are two-dimensionally disposed on the OLED panel.

On the OLED panel, each pixel (display pixel) includes, in the case of the WRGB system, four sub-pixels of white (W), red (R), green (G), and blue (B), or includes, in the case of the RGB system, three sub-pixels of red (R), green (G), and blue (B).

It should be noted that FIG. 6 illustrates a minimum configuration for brevity of explanation. However, the display apparatus may additionally include, for example, other circuits and devices such as a sound signal processing circuit for processing sound signals and a speaker for outputting sounds based on the sound signals.

FIG. 7 illustrates an example of a detailed configuration of the signal processing section 111 depicted in FIG. 6.

Referring to FIG. 7, the signal processing section 111 includes a W conversion section 131, a hue detection section 132, a saturation detection section 133, a brightness detection section 134, an APL detection section 135, and a voltage control section 136.

In the signal processing section 111, the video signal from the signal input section 110 is supplied to the W conversion section 131 and the APL detection section 135. Further, the video signal is supplied to the panel driving section 113.

The W conversion section 131 performs a White conversion process on the video signal inputted thereto, and supplies the resulting W-converted video signal to the hue detection section 132, the saturation detection section 133, and the brightness detection section 134.

The hue detection section 132 performs a hue detection process on the video signal supplied from the W conversion section 131, and supplies the resulting processed hue information to the voltage control section 136. The hue detection process is performed to detect a hue (H) out of color space (HSV color space) components of the video signal.

The saturation detection section 133 performs a saturation detection process on the video signal supplied from the W conversion section 131, and supplies the resulting processed saturation information to the voltage control section 136. The saturation detection process is performed to detect saturation (S) out of the color space (HSV color space) components of the video signal.

The brightness detection section 134 performs a brightness detection process on the video signal supplied from the W conversion section 131, and supplies the resulting processed brightness information to the voltage control section 136. The brightness detection process is performed to detect brightness (V (Value)) out of the color space (HSV color space) components of the video signal.

The APL detection section 135 performs an APL detection process on the video signal inputted thereto, and supplies the resulting processed APL information to the voltage control section 136. The APL detection process is performed to detect an average pixel level (APL) on the basis of the video signal. The average pixel level (APL) is a value used as an index indicating the brightness of the entire screen of the panel section 114.

The voltage control section 136 receives the hue information from the hue detection section 132, the saturation information from the saturation detection section 133, the brightness information from the brightness detection section 134, and the APL information from the APL detection section 135. Further, the voltage control section 136 receives temperature information and amperage information from the panel driving section 113.

On the basis of at least one of the hue information, the saturation information, the brightness information, the APL information, the temperature information, and the amperage information, the voltage control section 136 performs adaptive control of the panel driving voltage for driving the panel section 114, according to a load and an application.

In the above instance, the power supply section 112 variably controls and supplies the panel driving voltage to the panel driving section 113 under control of the voltage control section 136. As a result, the panel section 114 is driven on the basis of the applied panel driving voltage.

For example, the voltage control section 136 performs control over the HSV color space on the basis of the hue information, the saturation information, and the brightness information. The control over the HSV color space will be described later in detail with reference to FIGS. 8 to 11. Further, the voltage control section 136 performs control over a luminance curve on the basis of the APL information. The control over the luminance curve will be described later in detail with reference to FIGS. 12 and 13. Moreover, the voltage control section 136 controls the panel driving voltage on the basis of the temperature information and the amperage information.

Referring to FIG. 7, the panel driving section 113 includes a panel temperature measurement section 151 and a panel current measurement section 152.

The panel temperature measurement section 151 supplies the temperature information to the voltage control section 136. The temperature information indicates the surface temperature of the panel section 114 which is measured, for example, by a temperature sensor provided in the panel section 114. Examples of the configuration of the temperature sensor will be described later with reference to FIGS. 14 and 15.

The panel current measurement section 152 supplies the amperage information to the voltage control section 136. The amperage information indicates the amperage of the panel driving voltage which is applied to the panel section 114 and which is measured, for example, by a current sensor provided in the panel section 114. An example of the configuration of the current sensor will be described later with reference to FIG. 16.

(HSV Control)

Figure 8:
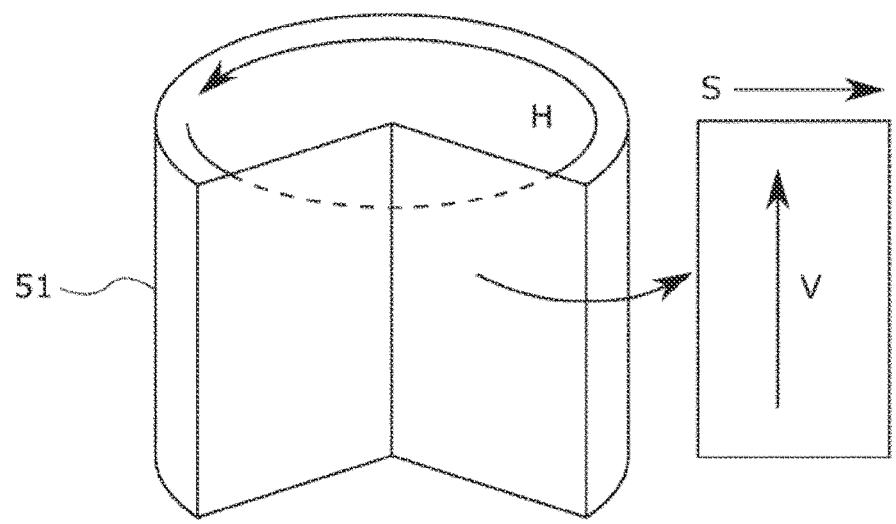
FIG. 8 is a diagram illustrating an example of a color expression range of a video signal.

FIG. 8 illustrates an example of a color expression range of a video signal.

In FIG. 8, the color expression range of the video signal is expressed in the HSV color space. The HSV color space is a color space having three components, namely, a hue (H), saturation (S), and brightness (V (Value)). In this instance, the hue indicates the type of color, the saturation indicates the vividness of color, and the brightness indicates the brightness of color.

Referring to FIG. 8, the HSV color space is indicated by a cylinder 51. In the cylinder 51 indicative of the HSV color space, its azimuth direction represents the hue H, its radial direction represents the saturation S, and its axial direction represents the brightness V. FIG. 8 depicts the HSV color space from which part of a cross-section of the hue H is cut out.

More specifically, the cylinder 51 indicative of the HSV color space corresponds to the range of color that is expressible by four sub-pixels of white (W), red (R), green (G), and blue (B) included in each pixel based on the WRGB system or three sub-pixels of red (R), green (G), and blue (B) included in each pixel based on the RGB system.

In the display apparatus 1, the current applied to each pixel on the panel section 114 varies according to the light emission level in the WRGB system or the RGB system. Therefore, in order to accurately grasp the load on the panel section 114, it is necessary to take color information into account.

Figure 9:
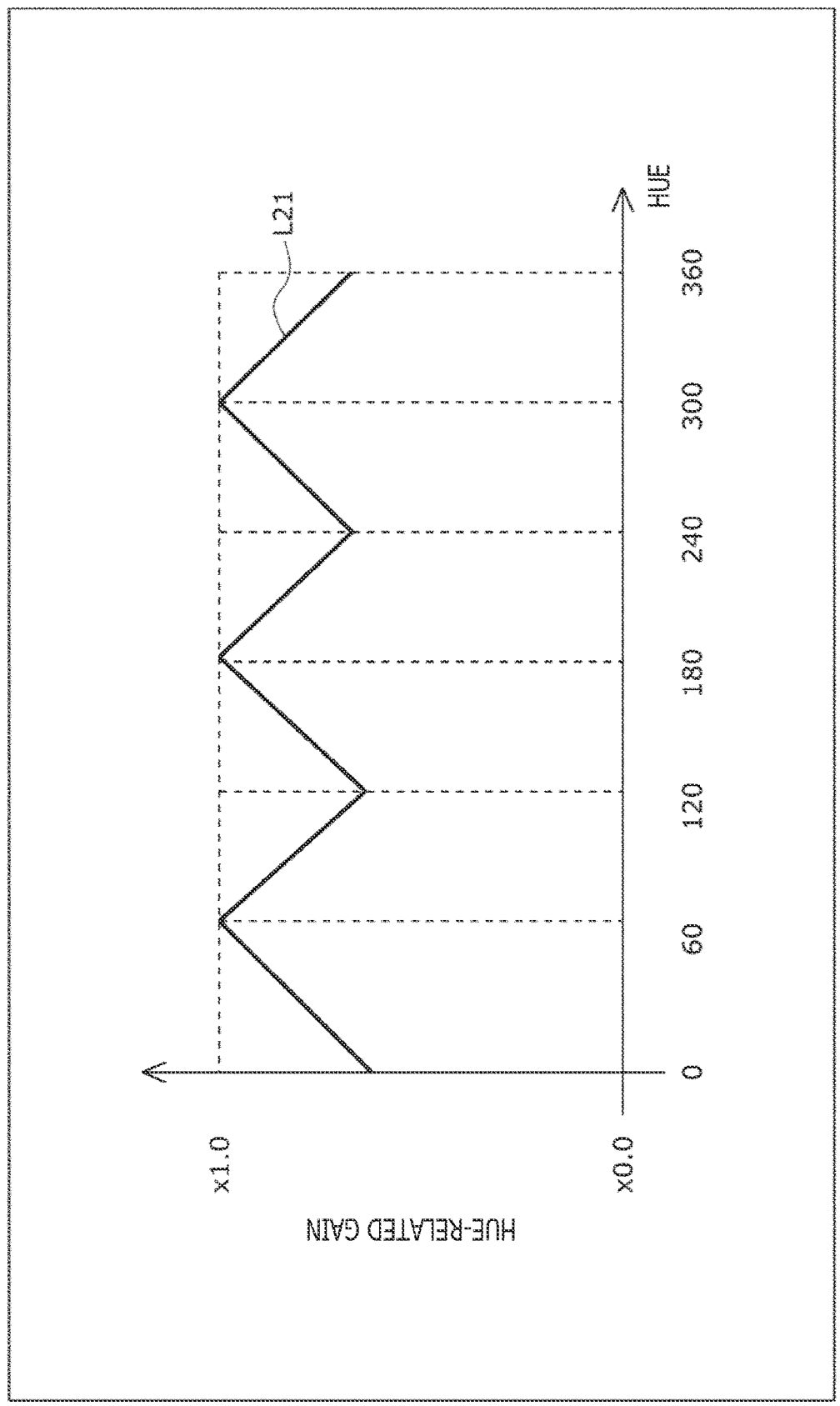
FIG. 9 is a diagram illustrating an example of gain control related to a hue.

FIG. 9 illustrates an example of gain control related to the hue H. In FIG. 9, the horizontal axis represents the hue H, and the vertical axis represents a hue-related gain.

The hue H represented by the horizontal axis is expressed by a value within the range of 0° to 360°. More specifically, a hue of 0° indicates red, a hue of 60° indicates yellow, a hue of 120° indicates green, a hue of 180° indicates cyan, a hue of 240° indicates blue, and a hue of 300° indicates magenta.

When the hue-related gain is to be controlled, the weight of a current load is determined for each hue H according to the characteristics of the OLED element of each pixel. Further, for complementary colors such as yellow (Y), cyan (C), and magenta (M), two sub-pixels of different colors among R, G, and B are made to emit light in each pixel. In this instance, the resulting load is higher than that in a case where a single sub-pixel of R, G, or B is made to emit light. This makes it necessary to adjust the weight.

Referring to FIG. 9, the hue-related gain dependent on the hue H is indicated by a thick line L21 in the form of a triangular wave. For the complementary colors, namely, yellow (Y), cyan (C), and magenta (M), the hue-related gain is multiplied by 1.0, and their weight is changed to be different from those of the other colors.

The voltage control section 136 adaptively controls the panel driving voltage by adjusting the weight with the use of the hue-related gain based on the hue information supplied from the hue detection section 132. This makes it possible to adjust the weight to suppress the load in a case where two sub-pixels of different colors among R, G, and B emit light, for example, by a video signal having the complementary color.

Figure 10:
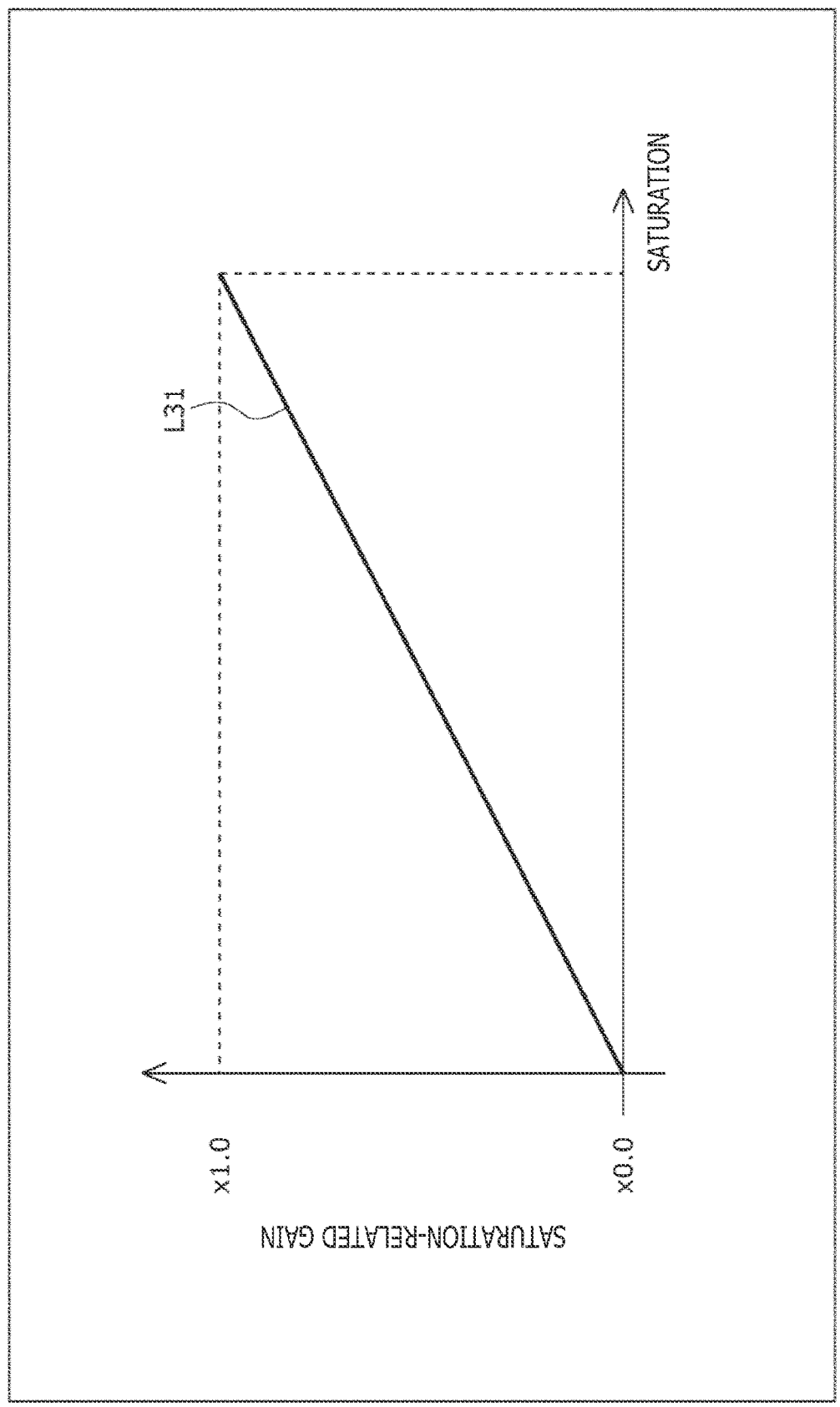
FIG. 10 is a diagram illustrating an example of gain control related to saturation.

FIG. 10 illustrates an example of gain control related to the saturation S. In FIG. 10, the horizontal axis represents the saturation S, and the vertical axis represents a saturation-related gain.

The saturation S represented by the horizontal axis is expressed by a value within the range of 0 to 1 (0% to 100%). More specifically, the saturation S varies with the distance from the central axis (achromatic color axis) of the cylinder 51 indicative of the HSV color space, that is, the saturation S remains at 0 in the case of achromatic color and increases with an increase in the distance from the achromatic color axis. The saturation S reaches the maximum value in the case of a pure color, for example.

When the saturation-related gain is to be controlled, the weight is controlled according to a shade of color. In each pixel of the WRGB system, the sub-pixel of W has a higher luminous efficacy than the other sub-pixels of R, G, and B. Therefore, the weight needs to be considered more significantly as the color is darker.

Referring to FIG. 10, the saturation-related gain dependent on the saturation S is indicated by a thick line L31 that is a straight line inclined upward to the right. When the saturation S increases, the gain also increases with a constant gradient. This makes it possible to change the weight in the direction of saturation. The saturation-related gain may be referred to as the high-saturation-related gain because it increases with an increase in the saturation.

The voltage control section 136 adaptively controls the panel driving voltage by adjusting the weight with the use of the saturation-related gain based on the saturation information supplied from the saturation detection section 133. This makes it possible to adjust the weight more significantly when the color is darker in the case of the WRGB system, thereby suppressing the load.

Incidentally, in the case of the RGB system, all the sub-pixels of R, G, and B in each pixel are made to emit light to express white (W). Therefore, the weight needs to be considered more significantly as the color is lighter. In this case, the saturation-related gain dependent on the saturation S is indicated by a straight line inclined downward to the right such that the gain increases with a constant gradient when the saturation S decreases. This makes it possible to adjust the weight more significantly when the color is lighter in the case of the RGB system, thereby suppressing the load.

Figure 11:
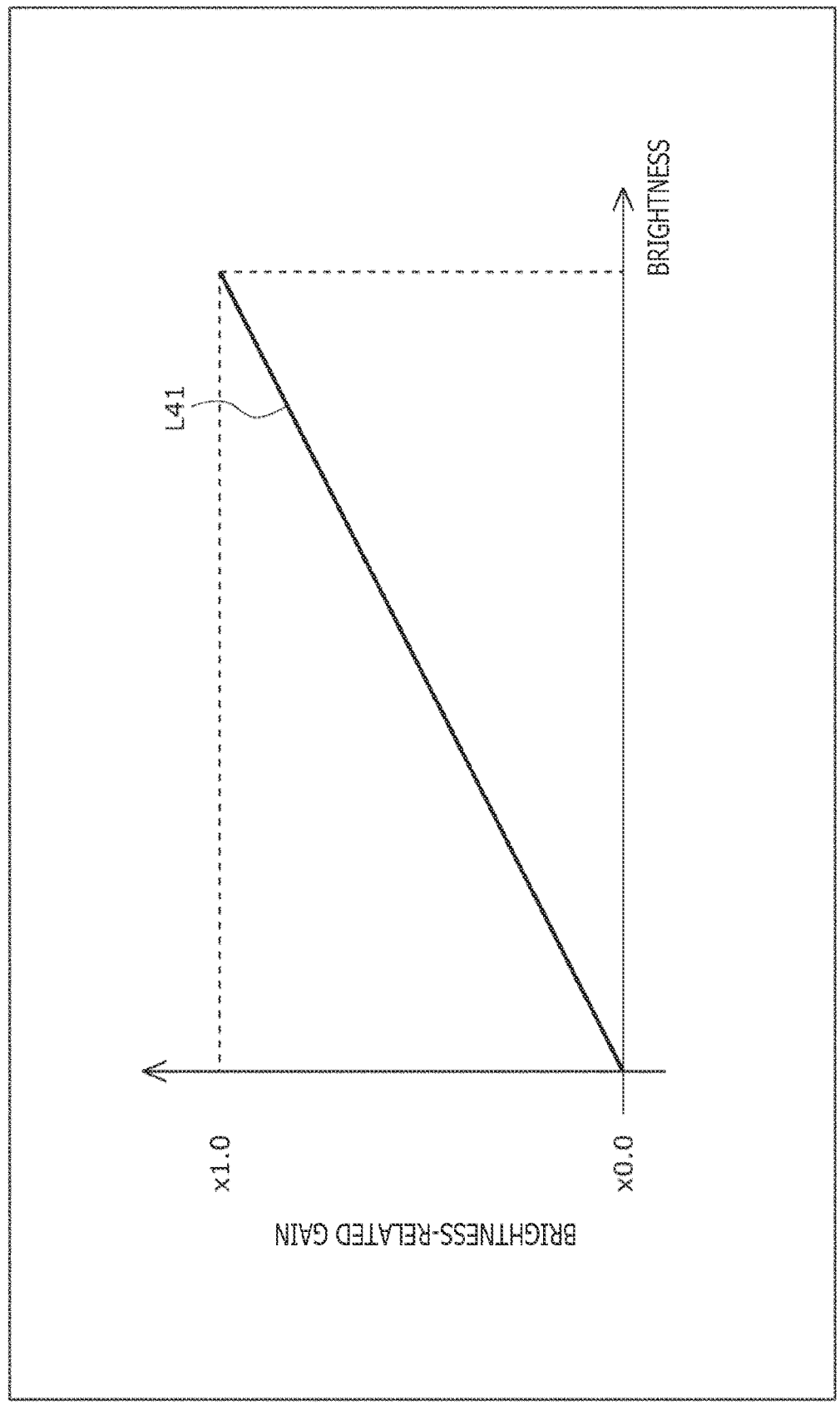
FIG. 11 is a diagram illustrating an example of gain control related to brightness.

FIG. 11 illustrates an example of gain control related to the brightness V. In FIG. 11, the horizontal axis represents the brightness V, and the vertical axis represents a brightness-related gain.

The brightness V represented by the horizontal axis is expressed by a value within the range of 0 to 1 (0% to 100%). More specifically, the brightness increases in the direction of height of the cylinder 51 indicative of the HSV color space, and color becomes bright when the brightness increases, and becomes dark when the brightness decreases.

When the brightness-related gain is to be controlled, the weight is controlled according to the signal level of a video signal. More specifically, when the light emission level of each pixel simply increases, the load becomes higher accordingly. Therefore, the brightness-related gain is controlled on the basis of a scheme related to such a load increase.

Referring to FIG. 11, the brightness-related gain dependent on the brightness V is indicated by a thick line L41 that is a straight line inclined upward to the right. When the brightness V increases, the gain also increases with a constant gradient. This makes it possible to change the weight in the direction of brightness. The brightness-related gain may be referred to as the high-brightness-related gain because it increases with an increase in the brightness.

The voltage control section 136 adaptively controls the panel driving voltage by adjusting the weight with the use of the brightness-related gain based on the brightness information supplied from the brightness detection section 134. This makes it possible to adjust the weight to suppress the load in a case where the light emission level of a pixel is high.

In such a manner as described above, the voltage control section 136 controls the gains (hue-related gain, saturation-related gain, and brightness-related gain) on the basis of information (hue information, saturation information, and brightness information) regarding the respective components (hue, saturation, and brightness) of the video signal expressed in the color space (HSV color space). Thus, the weight is adjusted according to the load on the respective components (hue, saturation, and brightness) of the video signal expressed in the color space (HSV color space).

(APL Luminance Control)

The OLED panel of an OLED display apparatus is characterized in that luminance decreases according to the brightness of the entire screen of the OLED panel. The reason why the OLED panel has such a characteristic is that pixels including the OLED elements are two-dimensionally disposed on the OLED panel and that the amperage of the entire screen increases with an increase in a light emission area of the OLED panel. Therefore, the OLED panel is able to emit bright light in a case where the light emission area is small. However, when the light emission area increases, the amount of overall light emission decreases.

In order to take the above-described characteristics of the OLED display apparatus into account, the display apparatus 1 needs to predict the load on the panel section 114 according to the average pixel level (APL) indicative of the brightness of the entire screen of the panel section 114, and perform weighting on the basis of the light emission area of the panel section 114.

Figure 12:
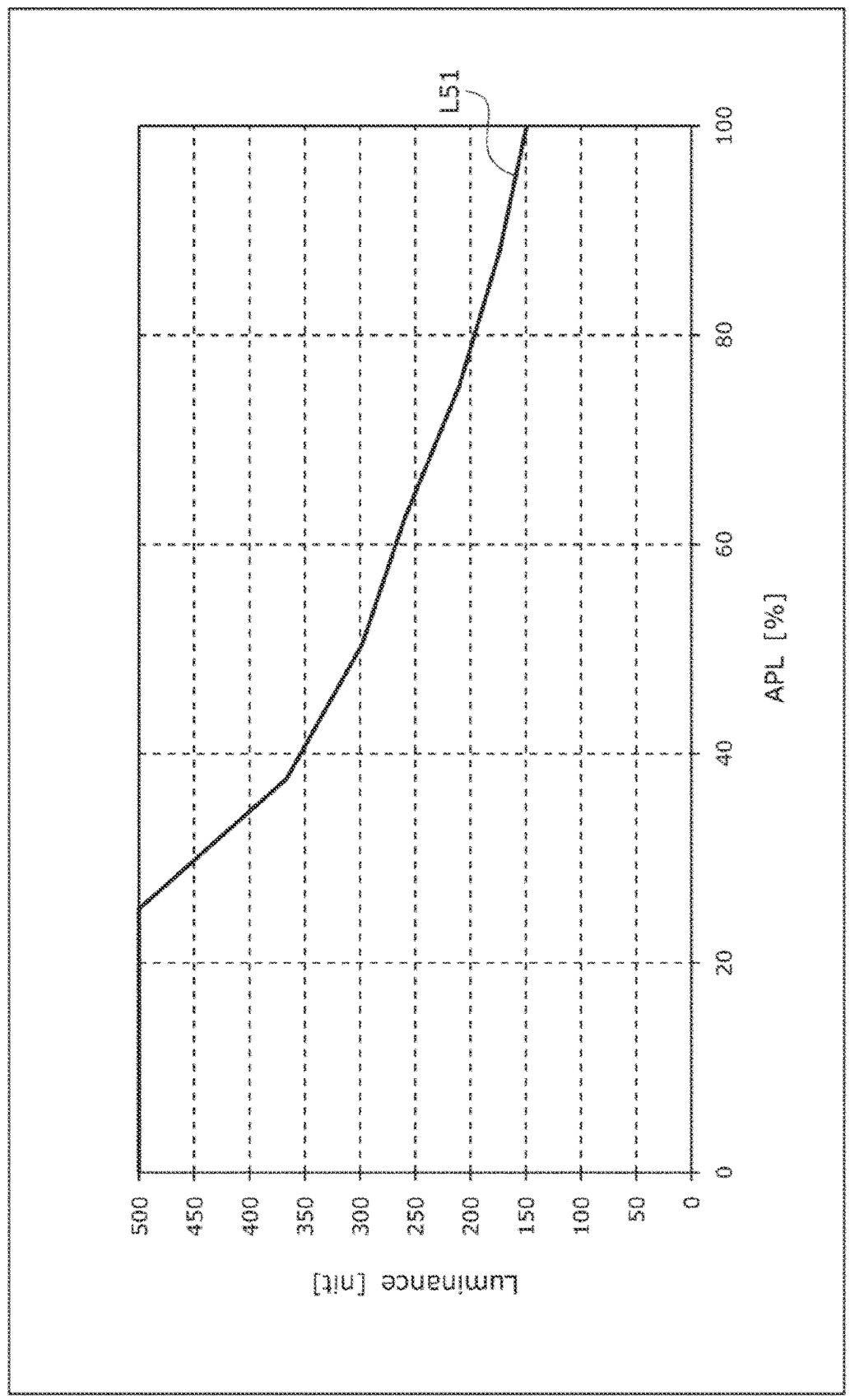
FIG. 12 is a diagram illustrating a first example of the relation between an APL and light emission luminance of the panel section.
Figure 13:
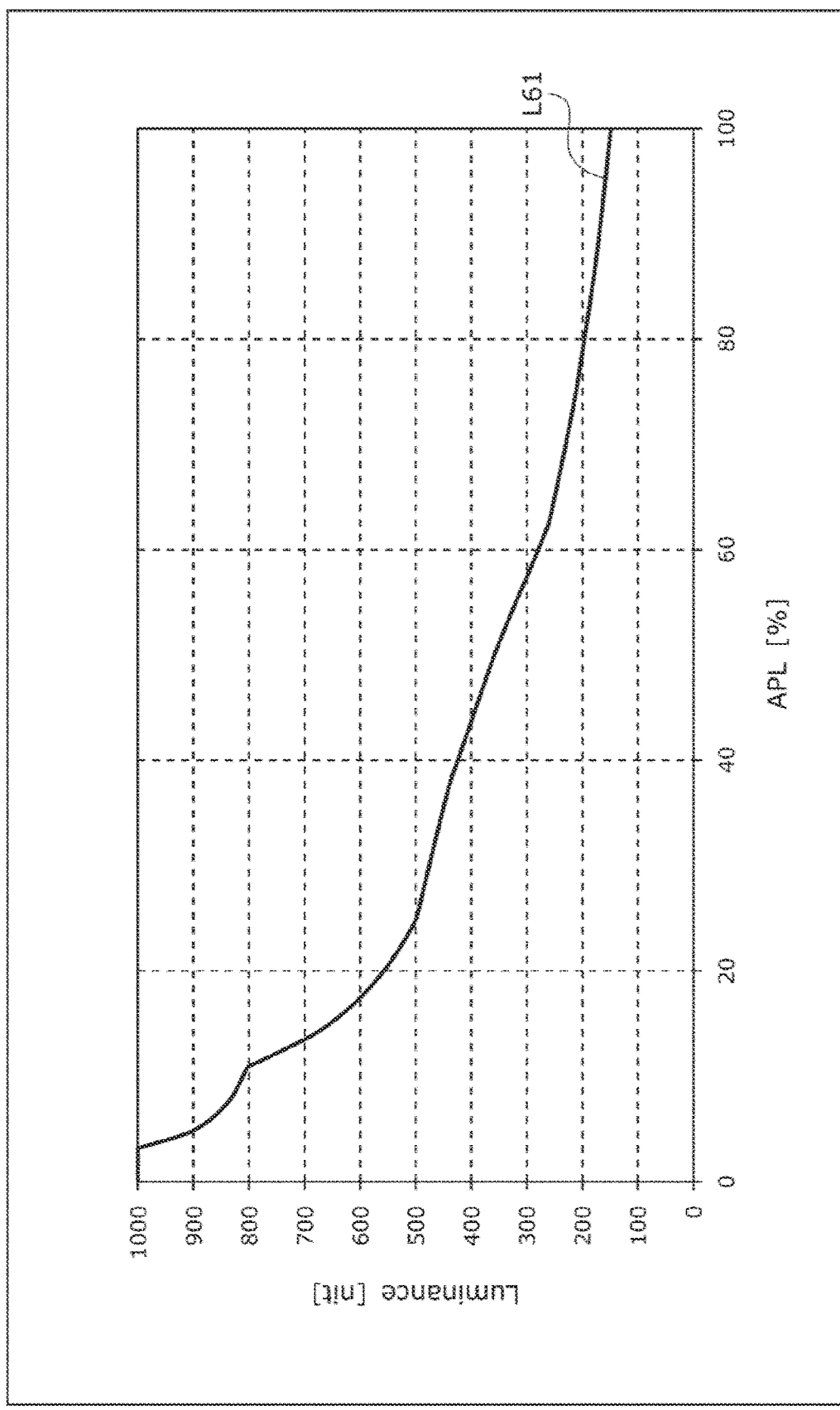
FIG. 13 is a diagram illustrating a second example of the relation between an APL and light emission luminance of the panel section.

FIGS. 12 and 13 illustrate examples of the relation between the average pixel level (APL) and light emission luminance of the panel section 114. In FIGS. 12 and 13, the horizontal axis represents the average pixel level (APL), and the vertical axis represents the luminance. The average pixel level (APL) represented by the horizontal axis is expressed by a value within the range of 0% to 100%.

Referring to FIG. 12, a thick line L51 indicates peak luminance control that is based on the average pixel level (APL) and that is performed over the sub-pixels of R, G, and B. As indicated by the thick line L51 which is a curved line in FIG. 12, the light emission luminance of the sub-pixels of R, G, and B gradually decreases with an increase in the value of the average pixel level (APL).

Referring to FIG. 13, a thick line L61 indicates peak luminance control that is based on the average pixel level (APL) and that is performed over the sub-pixel of W. As indicated by the thick line L61 in FIG. 13, the light emission luminance of the sub-pixel of W gradually decreases with an increase in the value of the average pixel level (APL).

Further, as can be seen from a comparison between the thick line L51 in FIG. 12 and the thick line L61 in FIG. 13, the sub-pixel of W has a higher luminous efficacy than the sub-pixels of R, G, and B.

The voltage control section 136 adaptively controls the panel driving voltage by controlling the luminance curve (e.g., thick line L51 or thick line L61) on the basis of the average pixel level (APL) derived from the APL information, which is supplied from the APL detection section 135, and performing weighting according to the light emission area of the panel section 114 (adjusting the weight according to the load imposed on the panel section 114). Consequently, in the display apparatus 1 configured as the OLED display apparatus, it is possible to perform driving based on the characteristics of the panel section 114 configured as the OLED panel.

(Panel Surface Temperature Measurement)

The display apparatus 1 is able to provide improved accuracy not only by allowing the signal processing section 111 to perform signal processing for predicting the load on a video, but also by allowing, for example, a temperature sensor to measure the surface temperature of the panel section 114.

Figure 14:
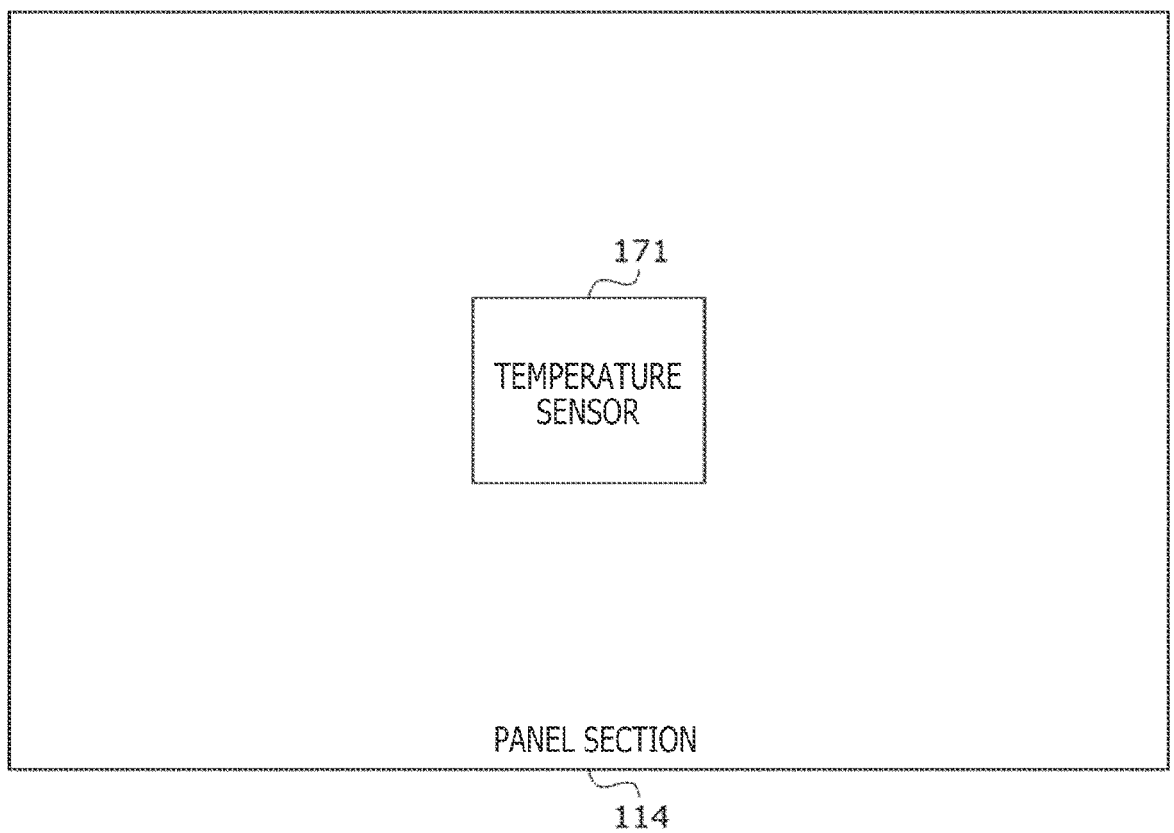
FIG. 14 is a diagram illustrating a configuration example of one temperature sensor provided in the panel section.

FIG. 14 illustrates a configuration example of one temperature sensor provided in the panel section 114. Referring to FIG. 14, a temperature sensor 171 is disposed at a position corresponding to the substantially central portion of the screen of the panel section 114 in order to measure the surface temperature of the panel section 114. It should be noted that the temperature sensor 171 need not always be disposed at the position corresponding to the substantially central portion of the screen. The temperature sensor 171 may alternatively be disposed at a different position.

Figure 15:
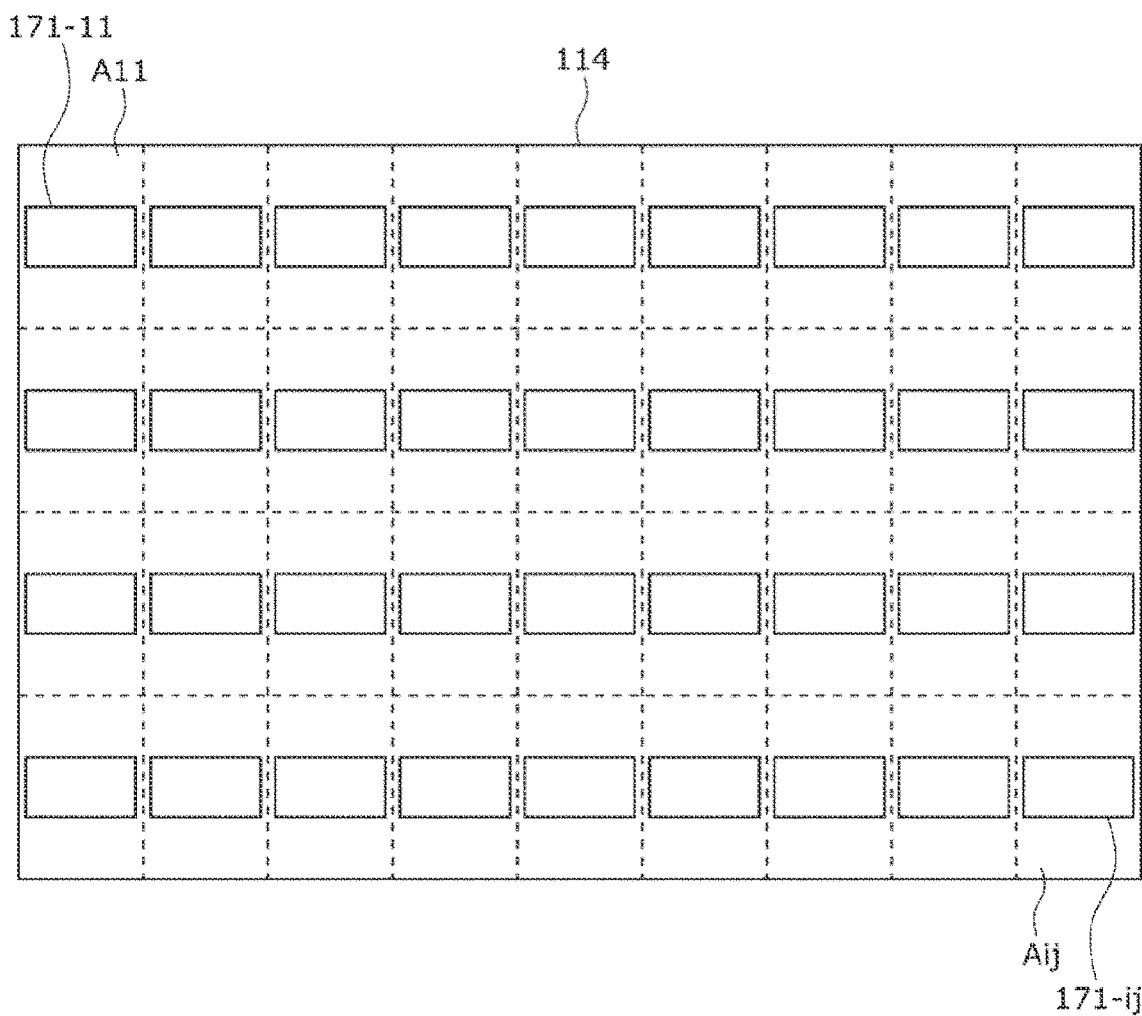
FIG. 15 is a diagram illustrating a configuration example of multiple temperature sensors provided in the panel section.

FIG. 15 illustrates a configuration example of multiple temperature sensors provided in the panel section 114. In the example illustrated in FIG. 15, the area of the entire screen of the panel section 114 is divided into 4×9 areas that are equal in size and arranged in the vertical and horizontal directions, and the temperature sensor 171 is disposed in each of the divided areas. It should be noted that, for the convenience of explanation, broken lines indicative of the boundaries of the divided areas are depicted on the screen of the panel section 114.

In FIG. 15, numbers corresponding to positions of the divided areas A in the vertical direction and the horizontal direction are illustrated. For example, the divided area at the upper left on the screen of the panel section 114 is indicated as a divided area A11, and the divided area at the lower right is indicated as a divided area Aij. Further, numbers corresponding to positions of the temperature sensors 171 in the vertical direction and the horizontal direction are illustrated. For example, the temperature sensor at the upper left is indicated as a temperature sensor 171-11, and the temperature sensor at the lower right is indicated as a temperature sensor 171-ij.

In the above numbering system, i is a number representing a position in the vertical direction, and j is a number representing a position in the horizontal direction. That is, while FIG. 15 depicts an example where the screen of the panel section 114 is divided into 4×9 divided areas, the screen of the panel section 114 can be divided into i×j (i and j are integers of 1 or greater) divided areas A. Accordingly, the number of divided areas A where the temperature sensors 171 are to be disposed is determined as desired.

Referring to FIG. 15, the temperature sensor 171-11 measures the surface temperature of the divided area A11 of the screen of the panel section 114. Although redundant explanations are avoided here, as is the case with the temperature sensor 171-11, the temperature sensor 171-ij measures the surface temperature of the divided area Aij corresponding to the position where the temperature sensor 171-ij is disposed.

The temperature sensor 171 depicted in FIG. 14 and the temperature sensors 171-11 to 171-ij depicted in FIG. 15 correspond to the panel temperature measurement section 151 depicted in FIG. 7. In a case where multiple temperature sensors 171-11 to 171-ij are disposed in the panel section 114, the surface temperature can be measured more accurately than in a case where one temperature sensor 171 is disposed in the panel section 114.

The surface temperature measured by the temperature sensor depicted in FIG. 14 or each of the surface temperatures measured by the temperature sensors 171-11 to 171-ij depicted in FIG. 15 is supplied to the voltage control section 136 as the temperature information. The voltage control section 136 controls the panel driving voltage on the basis of the temperature information supplied from the temperature sensor 171 depicted in FIG. 14 or other temperature sensors.

(Panel Amperage Measurement)

Further, the display apparatus 1 is able to provide improved accuracy not only by allowing the signal processing section 111 to perform signal processing for predicting the load on a video, but also by allowing, for instance, a current sensor to measure, for example, the amperage dependent on the panel driving voltage applied to the panel section 114.

In a case where one current sensor is to be provided in the panel section 114, the current sensor may be disposed on a power supply substrate for generating the panel driving voltage or disposed on the panel section 114 itself.

Figure 16:
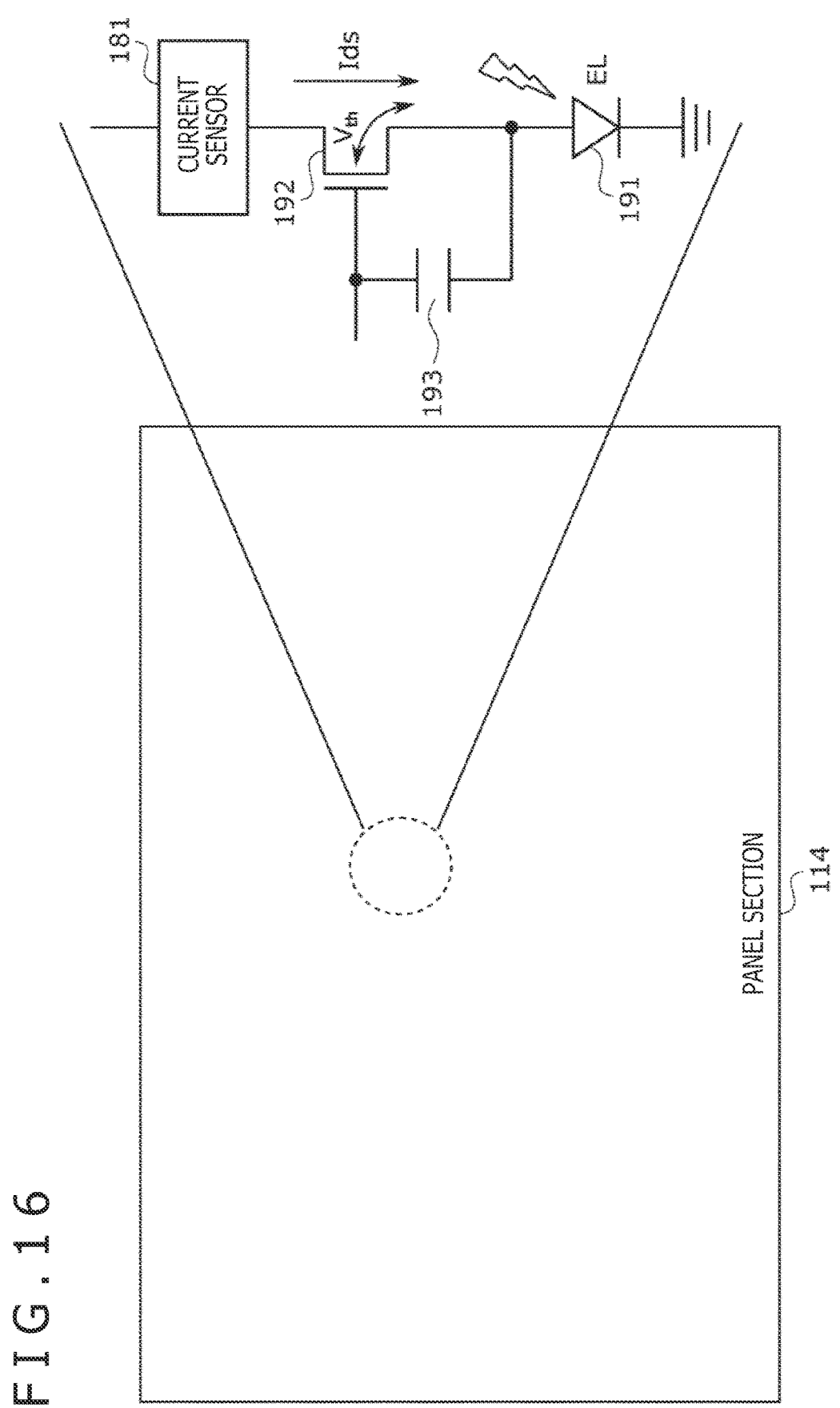
FIG. 16 is a diagram illustrating a configuration example of multiple current sensors provided in the panel section.

In a case where multiple current sensors are to be provided in the panel section 114, the load on each pixel can be measured with increased accuracy when the current sensors are disposed in a drive transistor for driving the pixels including the OLED elements. FIG. 16 illustrates a configuration example of the multiple current sensors provided in the panel section 114.

FIG. 16 is an enlarged view illustrating a circuit configuration of a sub-pixel included in one of the pixels that are two-dimensionally disposed on the panel section 114. Referring to FIG. 16, the sub-pixel includes an OLED element 191, a drive transistor 192, and a retention capacitive element 193. The drive transistor 192 which is configured, for example, as a TFT (Thin Film Transistor) is connected between the OLED element 191 and a drive circuit (not depicted). When a current Ids dependent on a voltage supplied from the drive circuit flows from the drive transistor 192 to the OLED element 191, the OLED element 191 emits light at a light emission luminance based on the current Ids.

Referring to FIG. 16, a current sensor 181 is connected between the drive transistor 192 and the drive circuit. The current sensor 181 measures the current Ids supplied to the OLED element 191.

The current sensor 181 depicted in FIG. 16 corresponds to the panel current measurement section 152 depicted in FIG. 7. The current measured by the current sensor 181 depicted in FIG. 16 is supplied to the voltage control section 136 as the amperage information. The voltage control section 136 controls the panel driving voltage on the basis of the amperage information supplied, for example, from the current sensor 181 depicted in FIG. 16.

(Adaptive Voltage Control)

Figure 17:
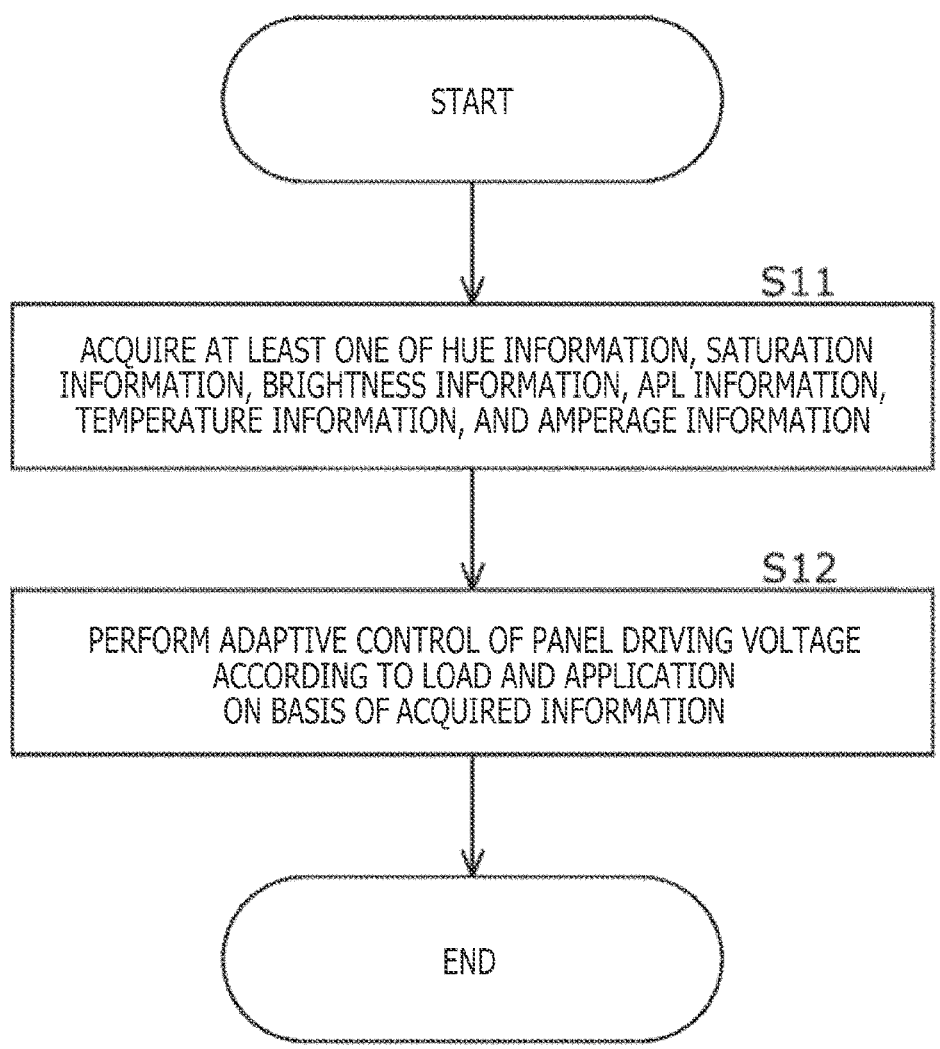
FIG. 17 is a flowchart illustrating a panel driving voltage control process.

FIG. 17 is a flowchart illustrating a panel driving voltage control process that is performed by the signal processing section 111.

In step S11, the voltage control section 136 acquires at least one of hue information, saturation information, brightness information, APL information, temperature information, and amperage information.

In the above instance, the hue information, the saturation information, and the brightness information are related to the color of a video to be displayed on the panel section 114. The APL information is related to the brightness of the screen of the panel section 114. The temperature information and the amperage information are measured as physical quantities related to the panel section 114.

In step S12, on the basis of the acquired information, the voltage control section 136 performs adaptive control of the panel driving voltage according to a load and an application.

The above-mentioned application includes use purposes such as increasing the luminance of the screen of the panel section 114, suppressing the temperature rise of the panel section 114, and reducing the power consumption of the panel section 114.

For example, in a case where the luminance is to be increased, the voltage control section 136 performs control on the basis of the acquired information to increase the panel driving voltage upon detection of, for example, a state where an APL value is smaller than a reference value and where the light emission area of the panel section 114 is comparatively small, and a state where the video signal has color component values preferably smaller than reference values and where the signal level of the video signal is higher than a reference value.

Further, in a case where the load increases with an increase in the panel driving voltage, the voltage control section 136 is capable of performing such control as to apply feedback until the load becomes constant while the surface temperature and the amperage are measured, and restore the value of the panel driving voltage to a predetermined state, for example.

For example, in a case where the temperature rise is to be suppressed, the voltage control section 136 performs control on the basis of the acquired information to decrease the panel driving voltage upon detection of, for example, a state where the APL value is greater than the reference value and the light emission area is comparatively large, and a state where the video signal has color component values preferably greater than the reference values and the signal level of the video signal is higher than the reference value.

Further, in a case where the load decreases with a decrease in the panel driving voltage, the voltage control section 136 is capable of performing such control as to apply feedback until the load becomes constant while the surface temperature and the amperage are measured, and restore the value of the panel driving voltage to a predetermined state, for example.

In such a manner as described above, while the load is measured, the voltage control section 136 is able to adaptively control the panel driving voltage on the basis of the acquired information in order to achieve purposes such as increasing the luminance, suppressing the temperature rise, and reducing the power consumption.

It should be noted that, in a case where the back surface of the panel section 114 includes a heat dissipation material cheaper than the conventional material for the purpose of reducing the cost, for example, the signal processing section 111 is able to decrease the load and suppress the temperature rise by exercising control to decrease the panel driving voltage upon detection of a high load video signal and a temperature rise.

Specific Configuration Example

Figure 18:
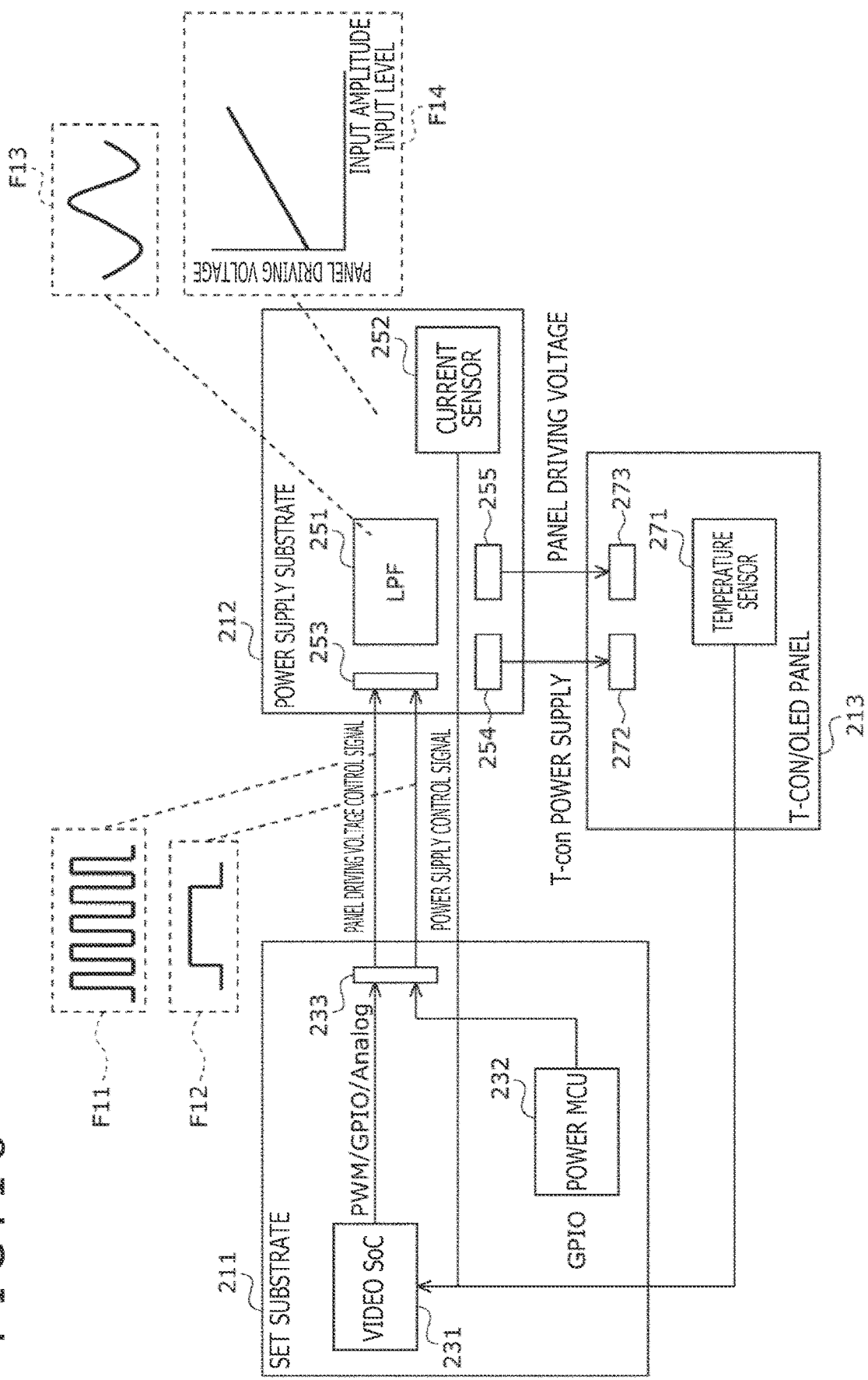
FIG. 18 is a diagram illustrating a specific configuration example of the display apparatus to which the present technology is applied.

FIG. 18 illustrates a specific configuration example of the display apparatus to which the present technology is applied.

The display apparatus 1 depicted in FIG. 6 can include a set substrate 211, a power supply substrate 212, and a T-CON/OLED panel 213.

The set substrate 211 includes a video SoC 231, a power MCU 232, and an OF section 233. The video SoC 231 performs a video signal process on a video signal inputted thereto. The video SoC 231 is a signal processing device having the functions of the signal processing section 111 depicted in FIG. 6.

More specifically, the video SoC 231 performs HSV control and APL luminance control, and controls the panel driving voltage by using, for example, PWM signals and analog signals dependent on such HSV control and APL luminance control. In the example depicted in FIG. 18, the PWM signal is outputted from the video SoC 231 to the power supply substrate 212 through the OF section 233, as a panel driving voltage control signal (a signal dependent on a rectangular wave inside a frame F11 in FIG. 18).

The power MCU 232 issues an instruction for turning on or off the power supply on the basis of a signal from a GPIO (General Purpose Input/Output). A power supply control signal (a signal dependent on a pulse wave inside a frame F12 in FIG. 18) is outputted from the power MCU 232 to the power supply substrate 212 through the OF section 233.

The power supply substrate 212 corresponds to the power supply section 112 depicted in FIG. 6. The power supply substrate 212 includes an LPF 251, a current sensor 252, an OF section 253, an OF section 254, and an OF section 255.

The power supply substrate 212 is configured such that, in a case where the PWM signal is inputted from the set substrate 211 to the OF section 253, the LPF 251 restores the inputted signal to an analog signal (a waveform inside a frame F13 in FIG. 18). It should be noted that, in a case where an analog signal is inputted from the set substrate 211, the analog signal is only required to be used without change.

Further, the power supply substrate 212 is configured such that the panel driving voltage is variably controlled according to input amplitude and an input level on the basis of the analog signal (a linear relation depicted inside a frame F14 in FIG. 18). The panel driving voltage is applied to the OLED panel of the T-CON/OLED panel 213 through the I/F section 255. In this instance, the panel driving voltage may drive the entire screen of the OLED panel or drive each of predetermined areas such as areas corresponding to power wiring. The panel driving voltage is a voltage for driving the OLED panel (e.g., an EVDD voltage).

The current sensor 252 measures the amperage of the panel driving voltage applied to the OLED panel of the T-CON/OLED panel 213. The current sensor 252 feeds the measured amperage back to the video SoC 231 on the set substrate 211 as the amperage information. It should be noted that the current sensor 252 may alternatively be disposed, for example, on the OLED panel of the T-CON/OLED panel 213.

It should be noted that the power supply substrate 212 turns the power supply on and off on the basis of the power supply control signal from the set substrate 211. Moreover, the power supply substrate 212 outputs T-CON power to a timing controller (T-CON) of the T-CON/OLED panel 213 through the I/F section 254.

The T-CON/OLED panel 213 corresponds to the panel driving section 113 and the panel section 114 depicted in FIG. 6. The T-CON/OLED panel 213 includes a temperature sensor 271, an I/F section 272, and an I/F section 273.

The OLED panel of the T-CON/OLED panel 213 performs driving on the basis of the panel driving voltage applied from the power supply substrate 212 through the I/F section 273. The timing controller (T-CON) of the T-CON/OLED panel 213 operates on the basis of the T-CON power inputted from the power supply substrate 212 through the I/F section 272.

The temperature sensor 271 measures the surface temperature of the OLED panel. The temperature sensor 271 feeds the measured surface temperature back to the video SoC 231 on the set substrate 211 as the temperature information.

The video SoC 231 on the set substrate 211 controls the panel driving voltage on the basis of at least either the amperage information fed back from the current sensor 252 or the temperature information fed back from the temperature sensor 271.

Another Configuration Example

Figure 19:
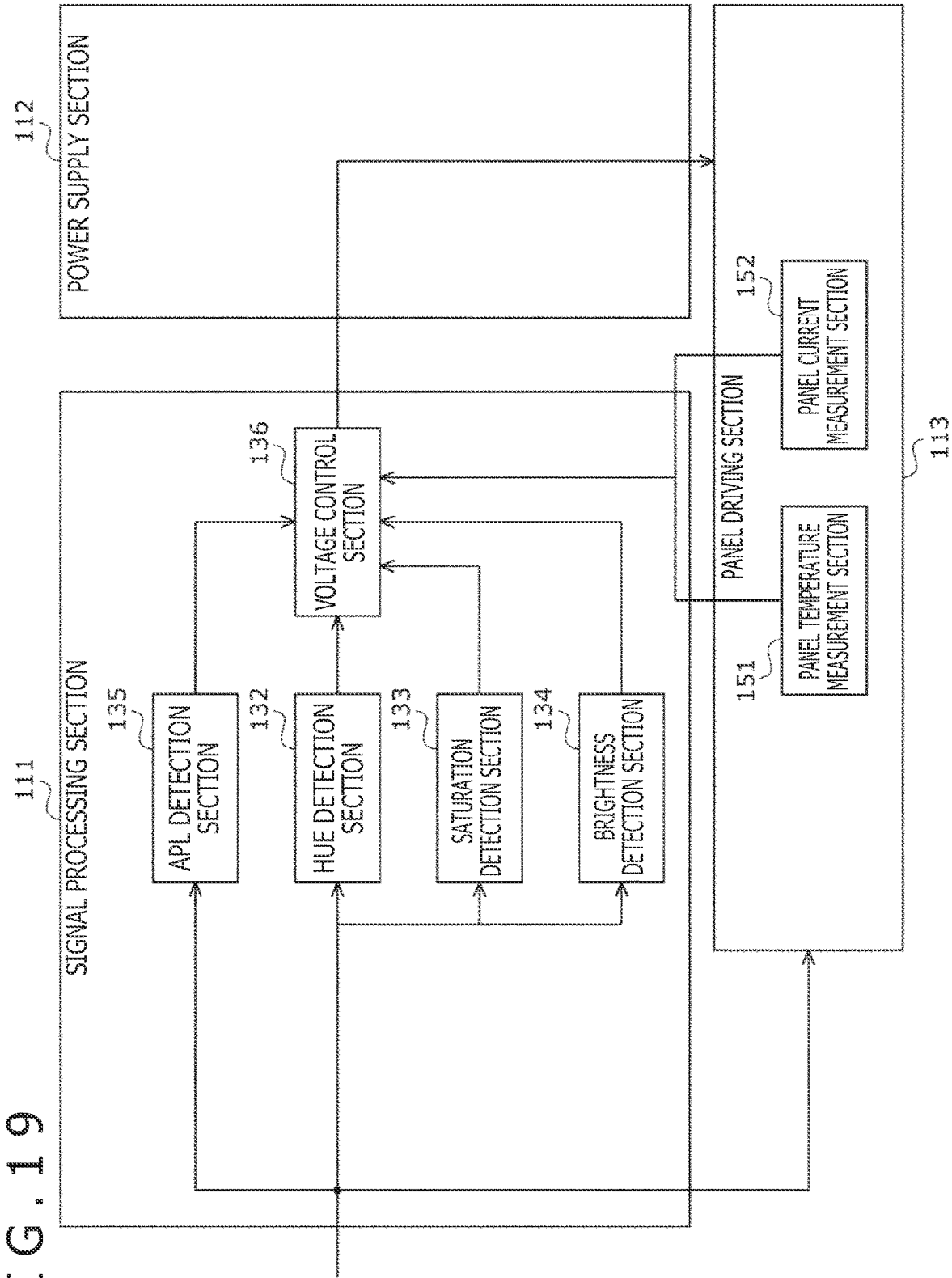
FIG. 19 is a block diagram illustrating another configuration example of the signal processing section.

FIG. 19 illustrates another configuration example of the signal processing section 111 depicted in FIG. 6.

FIG. 19 illustrates a detailed configuration of the signal processing section 111 for the RGB system. Therefore, the configuration depicted in FIG. 19 differs from the configuration depicted in FIG. 7, which illustrates a detailed configuration for the WRGB system. Component elements of the signal processing section 111 depicted in FIG. 19 that are identical with the component elements of the signal processing section 111 depicted in FIG. 7 are designated by the same reference signs and will not redundantly be described.

The signal processing section 111 depicted in FIG. 19 differs from the signal processing section 111 depicted in FIG. 7 in that the former does not include the W conversion section 131, which performs W conversion (e.g., WCT (White Color Translation)). More specifically, in the case of the RGB system, white color conversion is not required because each pixel in the RGB system does not include the sub-pixel of W. Therefore, in the signal processing section 111 depicted in FIG. 19, the video signal from the signal input section 110 is directly inputted not only to the APL detection section 135 but also to the hue detection section 132, the saturation detection section 133, and the brightness detection section 134.

The hue detection section 132 performs a hue detection process on the video signal inputted thereto. The saturation detection section 133 performs a saturation detection process on the video signal inputted thereto. The brightness detection section 134 performs a brightness detection process on the video signal inputted thereto.

2. Modifications

The foregoing description assumes that the signal processing section 111 is a component element of the display apparatus 1. However, the signal processing section 111 may alternatively be used as a stand-alone apparatus and may be regarded as a signal processing apparatus.

The foregoing description illustrates a case where the display apparatus 1 is a television receiver. However, the display apparatus 1 is not limited to a television receiver, and may alternatively be equipment such as a display. Examples of the display include a medical monitor, a broadcast monitor, a display for digital signage, and the like.

Further, the display apparatus 1 may be used as the display section of a PC (Personal Computer), a tablet terminal, a smartphone, a mobile phone, a video game console, a head-mounted display, in-vehicle equipment such as a car navigation system or a rear seat monitor, or a wearable device, for example, of a wristwatch type or an eyeglass type.

In the foregoing description, an OLED display apparatus having an OLED panel is exemplified as the display apparatus 1. However, the present technology is also applicable to other display apparatuses such as a self-luminous display apparatus having a self-luminous display panel.

The foregoing description illustrates a case where the pixels two-dimensionally disposed on the panel section 114 (display panel) each include four sub-pixels of white (W), red (R), green (G), and blue (B). However, the colors of the sub-pixels are not limited to the above-mentioned colors. For example, each pixel may include, instead of the sub-pixel of white (W), a sub-pixel of another color having a high luminosity factor comparable to that of white (W).

Further, the HSV color space is an example of a color space where colors are quantitatively expressed. A different color space may alternatively be used.

It should be noted that the term "OLED" may be read as "organic EL (electro luminescence)." For example, it can be said that the OLED display apparatus is an organic EL display apparatus. Further, as a video includes multiple image frames, the term "video" may be read as "image."

It should also be noted that the embodiment of the present technology is not limited to the above-described embodiment. The embodiment may variously be modified without departing from the spirit and scope of the present technology.

Moreover, advantages described in the present specification are merely illustrative and are not restrictive. The present technology can additionally provide advantages other than those described in the present specification.

It is to be noted that the present technology is also able to adopt the following configurations.

(1) A signal processing apparatus including:
a signal processing section that
acquires at least one of first information regarding a color of a video to be displayed on a panel section, second information regarding brightness of a screen of the panel section, and third information measured as a physical quantity related to the panel section, and
performs, on the basis of the acquired information, adaptive control of a voltage according to a load on and an application of the panel section, the voltage being used for driving the panel section.

(2) The signal processing apparatus according to (1) above, in which
the signal processing section performs, on the basis of the acquired information, adaptive control of the voltage according to the application while the load on the panel section is measured.

(3) The signal processing apparatus according to (1) or (2) above, in which
the first information includes information regarding components of a color space.

(4) The signal processing apparatus according to (3) above, in which
the color space includes an HSV color space, and
the components of the color space include a hue, saturation, and brightness.

(5) The signal processing apparatus according to (4) above, in which
the signal processing section adjusts weight according to the load on the panel section by controlling a gain related to a hue, saturation, or brightness.

(6) The signal processing apparatus according to any one of (1) to (5) above, in which
the second information includes information regarding an average pixel level indicative of brightness of the entire screen of the panel section.

(7) The signal processing apparatus according to (6) above, in which
the signal processing section adjusts the weight according to the load on the panel section by controlling a luminance curve on the basis of the average pixel level.

(8) The signal processing apparatus according to any one of (1) to (7) above, in which
the third information includes a physical quantity indicating at least either a surface temperature of the panel section or amperage based on the voltage applied to the panel section.

(9) The signal processing apparatus according to (8) above, in which the signal processing section performs feedback control of the load on the panel section on the basis of a result of measurement of the surface temperature or of the amperage.

(10) The signal processing apparatus according to (8) or (9) above, in which the panel section is provided with one or more temperature sensors for measuring the surface temperature.

(11) The signal processing apparatus according to (8) or (9) above, in which the panel section or a power supply substrate for generating the voltage is provided with one or more current sensors for measuring the amperage.

(12) The signal processing apparatus according to any one of (1) to (11) above, in which the application includes an application for achieving an increase in luminance of the screen of the panel section, suppression of a temperature rise in the panel section, or a reduction in power consumption of the panel section.

(13) The signal processing apparatus according to (12) above, in which, in a case where the luminance of the screen of the panel section is to be increased, the signal processing section increases the voltage upon detection of a state where a value of the average pixel level that is included in the second information and that is indicative of the brightness of the entire screen of the panel section is smaller than a reference value and where a light emission area of the panel section is comparatively small, and a state where a video signal has a color component whose value is smaller than a reference value according to information that is included in the first information and that is related to the components of the color space and where a signal level of the video signal is higher than a reference value.

(14) The signal processing apparatus according to (13) above, in which, in a case where the load on the panel section is increased when the voltage is increased, the signal processing section exercises control to restore the voltage to a predetermined state, by performing feedback control on the basis of a result of measurement of a physical quantity that is included in the third information and that is indicative of at least either the surface temperature of the panel section or the amperage based on the voltage applied to the panel section.

(15) The signal processing apparatus according to (12) above, in which, in a case where the temperature rise in the panel section is to be suppressed, the signal processing section decreases the voltage upon detection of a state where a value of the average pixel level that is included in the second information and that is indicative of the brightness of the entire screen of the panel section is greater than a reference value and where a light emission area of the panel section is comparatively large, and a state where a video signal has a color component whose value is greater than a reference value according to information that is included in the first information and that is related to the components of the color space and where a signal level of the video signal is higher than a reference value.

(16) The signal processing apparatus according to (15) above, in which, in a case where the load on the panel section is decreased when the voltage is decreased, the signal processing section exercises control to restore the voltage to a predetermined state, by performing feedback control on the basis of a result of measurement of a physical quantity that is included in the third information and that is indicative of at least either the surface temperature of the panel section or the amperage based on the voltage applied to the panel section.

(17) The signal processing apparatus according to any one of (1) to (16) above, in which the panel section includes an OLED panel.

(18) A signal processing method including:

by a signal processing apparatus, acquiring at least one of first information regarding a color of a video to be displayed on a panel section, second information regarding brightness of a screen of the panel section, and third information measured as a physical quantity related to the panel section; and performing, on the basis of the acquired information, adaptive control of a voltage according to a load on and an application of the panel section, the voltage being used for driving the panel section.

(19) A display apparatus including:

a signal processing section that processes a video signal; and a panel section that displays a video based on the video signal, in which the signal processing section acquires at least one of first information regarding a color of a video to be displayed on a panel section, second information regarding brightness of a screen of the panel section, and third information measured as a physical quantity related to the panel section, and performs, on the basis of the acquired information, adaptive control of a voltage according to a load on and an application of the panel section, the voltage being used for driving the panel section.

(20) The display apparatus according to (19) above, in which the panel section includes an OLED panel.

REFERENCE SIGNS LIST

1: Display apparatus
110: Signal input section
111: Signal processing section
112: Power supply section
113: Panel driving section
114: Panel section
131: W conversion section
132: Hue detection section
133: Saturation detection section
134: Brightness detection section
135: APL detection section
136: Voltage control section
151: Panel temperature measurement section
152: Panel current measurement section
171: Temperature sensor
181: Current sensor
191: OLED element
192: Drive transistor
193: Retention capacitive element
211: Set substrate
212: Power supply substrate
213: T-CON/OLED panel
231: Video SoC
232: Power MCU
233: I/F section
251: LPF
252: Current sensor
253, 254, 255: I/F section 271: Temperature sensor
272, 273: I/F section

The invention claimed is:

1. A display apparatus comprising:
a signal processing circuitry configured to process a video signal; and
a display panel configured to display a video based on the video signal, wherein
the signal processing circuitry is configured to
acquire at least one of first information regarding a color of a video to be displayed on the display panel, second information regarding brightness of a screen of the display panel, and third information measured as a physical quantity related to the display panel, and
perform, on a basis of the acquired information, control of a voltage according to a load on the display panel and an application, the voltage being used for driving the display panel while the load on the display panel is measured.

2. The display apparatus according to claim 1, wherein the application includes an application for achieving an increase in luminance of the screen of the display panel, or suppression of a temperature rise in the display panel.

3. The display apparatus according to claim 1, wherein the first information includes information regarding components of a color space.

4. The display apparatus according to claim 3, wherein the color space includes an HSV color space, and
the components of the color space include a hue, saturation, and brightness.

5. The display apparatus according to claim 4, wherein the signal processing circuitry is configured to adjust weight according to the load on the display panel by controlling a gain related to a hue, saturation, or brightness.

6. The display apparatus according to claim 1, wherein the second information includes information regarding an average pixel level indicative of brightness of the entire screen of the display panel.

7. The display apparatus according to claim 6, wherein the signal processing circuitry is configured to adjust weight according to the load on the display panel by controlling a luminance curve on a basis of the average pixel level.

8. The display apparatus according to claim 1, wherein the third information includes a physical quantity indicating at least either a surface temperature of the display panel or amperage based on the voltage applied to the display panel.

9. The display apparatus according to claim 8, wherein the signal processing circuitry is configured to perform feedback control of the load on the display panel on a basis of a result of measurement of the surface temperature or of the amperage.

10. The display apparatus according to claim 8, wherein the display panel is provided with one or more temperature sensors for measuring the surface temperature.

11. The display apparatus according to claim 8, wherein the display panel or a power supply substrate for generating the voltage is provided with one or more current sensors for measuring the amperage.

12. The display apparatus according to claim 1, wherein the application includes an application for achieving an increase in luminance of the screen of the display panel, suppression of a temperature rise in the display panel, or a reduction in power consumption of the display panel.

13. The display apparatus according to claim 12, wherein, in a case where the luminance of the screen of the display panel is to be increased, the signal processing circuitry is configured to increase the voltage upon detection of a state where a value of an average pixel level that is included in the second information and that is indicative of brightness of the entire screen of the display panel is smaller than a reference value, and a state where the video signal has a color component whose value is smaller than a reference value according to information that is included in the first information and that is related to components of a color space and where a signal level of the video signal is higher than a reference value.

14. The display apparatus according to claim 13, wherein, in a case where the load on the display panel is increased when the voltage is increased, the signal processing circuitry is configured to exercise control to restore the voltage to a predetermined state, by performing feedback control on a basis of a result of measurement of the physical quantity that is included in the third information and that is indicative of at least either a surface temperature of the display panel or amperage based on the voltage applied to the display panel.

15. The display apparatus according to claim 12, wherein, in a case where the temperature rise in the display panel is to be suppressed, the signal processing circuitry is configured to decrease the voltage upon detection of a state where a value of an average pixel level that is included in the second information and that is indicative of brightness of the entire screen of the display panel is greater than a reference value, and a state where the video signal has a color component whose value is greater than a reference value according to information that is included in the first information and that is related to components of a color space and where a signal level of the video signal is higher than a reference value.

16. The display apparatus according to claim 15, wherein, in a case where the load on the display panel is decreased when the voltage is decreased, the signal processing circuitry is configured to exercise control to restore the voltage to a predetermined state, by performing feedback control on a basis of a result of measurement of the physical quantity that is included in the third information and that is indicative of at least either a surface temperature of the display panel or amperage based on the voltage applied to the display panel.

17. The display apparatus according to claim 1, wherein the display panel is an OLED panel.

18. The display apparatus according to claim 17, wherein the display panel includes display pixels each including white, red, green and blue sub pixels.

19. The display apparatus according to claim 17, wherein the display panel includes display pixels each including red, green and blue sub pixels.

20. The display apparatus according to claim 1, wherein the display apparatus is a television.

* * * * *